US008298933B2

(12) United States Patent
Shaviv et al.

(10) Patent No.: US 8,298,933 B2
(45) Date of Patent: Oct. 30, 2012

(54) CONFORMAL FILMS ON SEMICONDUCTOR SUBSTRATES

(75) Inventors: Roey Shaviv, Palo Alto, CA (US);
Sanjay Gopinath, Fremont, CA (US);
Peter Holverson, Dallas, TX (US);
Anshu A. Pradhan, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 542 days.

(21) Appl. No.: 12/467,200

(22) Filed: May 15, 2009

(65) Prior Publication Data

US 2010/0009533 A1 Jan. 14, 2010

Related U.S. Application Data

(63) Continuation-in-part of application No. 11/807,179, filed on May 24, 2007, now Pat. No. 7,842,605, which is a continuation-in-part of application No. 11/588,586, filed on Oct. 26, 2006, now Pat. No. 7,781,327, which is a continuation-in-part of application No. 10/804,353, filed on Mar. 18, 2004, now Pat. No. 7,186,648, which is a continuation-in-part of application No. 10/412,562, filed on Apr. 11, 2003, now Pat. No. 6,764,940, and a continuation-in-part of application No. 12/074,168, filed on Feb. 29, 2008, now Pat. No. 7,745,332.

(51) Int. Cl.
H01L 21/4763 (2006.01)
(52) U.S. Cl. .................. 438/627; 438/622; 438/628
(58) Field of Classification Search .................. 438/622, 438/627, 628
See application file for complete search history.

(56) References Cited

U.S. PATENT DOCUMENTS

| 3,763,031 A | 10/1973 | Scow et al. |
| 3,767,551 A | 10/1973 | Lang et al. |
| 4,058,430 A | 11/1977 | Suntola et al. |

(Continued)

FOREIGN PATENT DOCUMENTS

EP 0 692 551 A1 1/1996

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

Primary Examiner — James Mitchell
(74) Attorney, Agent, or Firm — Weaver Austin Villeneuve & Sampson LLP

(57) ABSTRACT

A layer of diffusion barrier or seed material is deposited on a semiconductor substrate having a recessed feature. The method may include a series of new deposition cycles, for example, a first net deposition cycle and a second net deposition cycle. The first net deposition cycle includes depositing a first deposited amount of the diffusion barrier or seed material and etching a first etched amount of the diffusion barrier or seed material. The second net deposition cycle including depositing a second deposited amount of the diffusion barrier or seed material and etching a second etched amount of the diffusion barrier or seed material. At least one of the process parameters of the first cycle differs from that of the second allows providing a graded deposition effects to reduce a risk of damaging any under layers and dielectric. A deposited layer of diffusion barrier or seed material is generally more conformal.

19 Claims, 16 Drawing Sheets

U.S. PATENT DOCUMENTS

| | | | |
|---|---|---|---|
| 4,392,111 A | 7/1983 | Rostoker | |
| 4,492,620 A | 1/1985 | Matsuo et al. | |
| 4,588,490 A | 5/1986 | Cuomo et al. | |
| 4,604,180 A | 8/1986 | Hirukawa et al. | |
| 4,609,903 A | 9/1986 | Toyokura et al. | |
| 4,622,121 A | 11/1986 | Wegmann et al. | |
| 4,737,384 A | 4/1988 | Murthy et al. | |
| 4,874,493 A | 10/1989 | Pan | |
| 4,963,524 A | 10/1990 | Yamazaki | |
| 4,997,539 A | 3/1991 | Komizo et al. | |
| 4,999,096 A | 3/1991 | Nihei et al. | |
| 5,009,963 A | 4/1991 | Ohmi et al. | |
| 5,084,412 A | 1/1992 | Nakasaki | |
| 5,126,028 A | 6/1992 | Hurwitt et al. | |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,904,565 A | 5/1999 | Nguyen et al. | |
| 5,948,215 A | 9/1999 | Lantsman | |
| 5,962,923 A | 10/1999 | Xu et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,051,114 A | 4/2000 | Yao et al. | |
| 6,074,544 A | 6/2000 | Reid et al. | |
| 6,077,403 A | 6/2000 | Kobayashi et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A | 8/2000 | Van Buskirk et al. | |
| 6,105,078 A | 8/2000 | Crockett et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,193,855 B1 | 2/2001 | Gopalraja et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,265,313 B1 | 7/2001 | Huang et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 | 1/2002 | Bjorkman et al. | |
| 6,342,133 B2 | 1/2002 | D'Couto et al. | |
| 6,342,448 B1 | 1/2002 | Lin et al. | |
| 6,350,353 B2 | 2/2002 | Gopalraja et al. | |
| 6,358,376 B1 | 3/2002 | Wang et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zao et al. | |
| 6,436,251 B2 | 8/2002 | Gopalraja et al. | |
| 6,440,854 B1 | 8/2002 | Rozbicki | |
| 6,444,104 B2 | 9/2002 | Gopalraja et al. | |
| 6,448,176 B1 | 9/2002 | Grill et al. | |
| 6,451,177 B1 | 9/2002 | Gopalraja et al. | |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,596,133 B1 | 7/2003 | Mosiehi et al. | |
| 6,605,534 B1 | 8/2003 | Chung et al. | |
| 6,607,977 B1 | 8/2003 | Rozbicki et al. | |
| 6,607,982 B1 | 8/2003 | Powell et al. | |
| 6,613,199 B1 | 9/2003 | Tobin et al. | |
| 6,624,066 B2 | 9/2003 | Lu et al. | |
| 6,642,146 B1 | 11/2003 | Rozbicki et al. | |
| 6,652,718 B1 | 11/2003 | D'Couto et al. | |
| 6,656,841 B1 | 12/2003 | Kim | |
| 6,660,622 B2 | 12/2003 | Chen et al. | |
| 6,673,716 B1 | 1/2004 | D'Couto et al. | |
| 6,683,425 B1 | 1/2004 | Lai | |
| 6,706,142 B2 | 3/2004 | Savas et al. | |
| 6,706,155 B2 | 3/2004 | Morimoto et al. | |
| 6,709,557 B1 | 3/2004 | Kailasam et al. | |
| 6,709,987 B2 | 3/2004 | Hashim et al. | |
| 6,755,945 B2 | 6/2004 | Yasar et al. | |
| 6,758,947 B2 | 7/2004 | Chiang et al. | |
| 6,764,940 B1 | 7/2004 | Rozbicki et al. | |
| 6,777,334 B2 | 8/2004 | Shiu et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,881,664 B2 | 4/2005 | Catabay et al. | |
| 6,893,541 B2 | 5/2005 | Chiang et al. | |
| 6,905,965 B2 | 6/2005 | Subrahmanyan et al. | |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 | 11/2005 | Lau | |
| 6,992,012 B2 | 1/2006 | Haskim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 7,452,743 B2 * | 11/2008 | Oliver et al. | 438/57 |
| 7,510,634 B1 | 3/2009 | Klawuhn et al. | |
| 7,645,696 B1 | 1/2010 | Dulkin et al. | |
| 7,659,197 B1 | 2/2010 | Juliano | |
| 7,682,966 B1 | 3/2010 | Rozbicki et al. | |
| 7,732,314 B1 | 6/2010 | Danek et al. | |
| 7,745,332 B1 | 6/2010 | Shaviv et al. | |
| 7,781,327 B1 | 8/2010 | Kailasam et al. | |
| 7,842,605 B1 | 11/2010 | Phadhan et al. | |
| 7,855,147 B1 | 12/2010 | Dulkin et al. | |
| 7,897,516 B1 | 3/2011 | Kinder et al. | |
| 7,922,880 B1 | 4/2011 | Pradhan et al. | |
| 8,017,523 B1 | 9/2011 | Wu et al. | |
| 8,043,484 B1 | 10/2011 | Rozbicki | |
| 2001/0039113 A1 | 11/2001 | Blalock et al. | |
| 2002/0000382 A1 | 1/2002 | Morrissey et al. | |

| | | | |
|---|---|---|---|
| 2002/0028576 | A1 | 3/2002 | Hashim et al. |
| 2002/0041028 | A1 | 4/2002 | Choi et al. |
| 2002/0110999 | A1 | 8/2002 | Lu et al. |
| 2002/0115287 | A1 | 8/2002 | Hashim et al. |
| 2002/0162736 | A1 | 11/2002 | Ngo et al. |
| 2003/0034244 | A1 | 2/2003 | Yasar et al. |
| 2003/0116427 | A1 | 6/2003 | Ding et al. |
| 2003/0129828 | A1 | 7/2003 | Cohen |
| 2003/0216035 | A1 | 11/2003 | Rengarajan et al. |
| 2004/0048461 | A1 | 3/2004 | Chen |
| 2004/0094402 | A1 | 5/2004 | Gopalraja et al. |
| 2004/0152301 | A1 | 8/2004 | Hashim et al. |
| 2004/0171250 | A1 | 9/2004 | Chiang et al. |
| 2004/0188239 | A1* | 9/2004 | Robison et al. ............ 204/192.3 |
| 2004/0211661 | A1 | 10/2004 | Zhang et al. |
| 2004/0216762 | A1 | 11/2004 | Lo et al. |
| 2004/0224507 | A1 | 11/2004 | Marieb et al. |
| 2004/0266175 | A1* | 12/2004 | Chen et al. ..................... 438/629 |
| 2005/0006222 | A1 | 1/2005 | Ding et al. |
| 2005/0020080 | A1 | 1/2005 | Chiang et al. |
| 2005/0032382 | A1 | 2/2005 | Rossman |
| 2005/0048767 | A1* | 3/2005 | Matsumoto ................... 438/629 |
| 2005/0085068 | A1 | 4/2005 | Chiang et al. |
| 2005/0085070 | A1 | 4/2005 | Park |
| 2005/0103620 | A1 | 5/2005 | Chistyakov |
| 2005/0106865 | A1 | 5/2005 | Chung et al. |
| 2005/0110147 | A1 | 5/2005 | Wu et al. |
| 2005/0127511 | A1* | 6/2005 | Yang et al. ..................... 257/758 |
| 2005/0173239 | A1 | 8/2005 | Somekh et al. |
| 2005/0186793 | A1 | 8/2005 | Omoto et al. |
| 2005/0211545 | A1 | 9/2005 | Cerio, Jr. et al. |
| 2005/0252765 | A1 | 11/2005 | Zhang et al. |
| 2005/0255690 | A1 | 11/2005 | Chen et al. |
| 2005/0255691 | A1 | 11/2005 | Ding et al. |
| 2005/0255700 | A1 | 11/2005 | Gopalraja et al. |
| 2005/0266682 | A1 | 12/2005 | Chen et al. |
| 2005/0272254 | A1 | 12/2005 | Ding et al. |
| 2005/0282378 | A1* | 12/2005 | Fukunaga et al. ............ 438/622 |
| 2006/0014378 | A1 | 1/2006 | Aggrawal et al. |
| 2006/0024953 | A1 | 2/2006 | Rao et al. |
| 2006/0030151 | A1 | 2/2006 | Ding et al. |
| 2006/0057843 | A1 | 3/2006 | Chen et al. |
| 2006/0073700 | A1* | 4/2006 | Brown et al. ................. 438/643 |
| 2006/0125100 | A1 | 6/2006 | Arakawa |
| 2006/0148253 | A1 | 7/2006 | Chung et al. |
| 2006/0166448 | A1* | 7/2006 | Cohen ........................... 438/296 |
| 2006/0207873 | A1 | 9/2006 | Fu |
| 2006/0258152 | A1 | 11/2006 | Haider |
| 2006/0286764 | A1* | 12/2006 | Zhang et al. .................. 438/424 |
| 2007/0020922 | A1 | 1/2007 | Chiang et al. |
| 2007/0059925 | A1* | 3/2007 | Choi et al. .................... 438/640 |
| 2007/0085211 | A1* | 4/2007 | Hamada ........................ 257/758 |
| 2007/0141831 | A1* | 6/2007 | Maekawa et al. ............. 438/622 |
| 2007/0178682 | A1 | 8/2007 | Chiang et al. |
| 2007/0184652 | A1* | 8/2007 | Frank et al. ................... 438/648 |
| 2007/0193982 | A1 | 8/2007 | Brown et al. |
| 2007/0197012 | A1 | 8/2007 | Yang et al. |
| 2007/0197021 | A1* | 8/2007 | Nam et al. .................... 438/622 |
| 2007/0222078 | A1* | 9/2007 | Furuya ........................... 257/758 |
| 2007/0252277 | A1 | 11/2007 | Tsao et al. |
| 2007/0257366 | A1* | 11/2007 | Wang et al. ................... 257/751 |
| 2007/0283886 | A1 | 12/2007 | Chung et al. |
| 2008/0067680 | A1* | 3/2008 | Sakai et al. ................... 257/751 |
| 2008/0142359 | A1 | 6/2008 | Gopalraja et al. |
| 2008/0190760 | A1 | 8/2008 | Tang et al. |
| 2008/0310005 | A1 | 12/2008 | Tonar et al. |
| 2009/0233438 | A1 | 9/2009 | Ding et al. |
| 2010/0009533 | A1 | 1/2010 | Shaviv et al. |

FOREIGN PATENT DOCUMENTS

| | | |
|---|---|---|
| JP | 56157037 | 12/1981 |
| JP | 09082696 | 3/1997 |
| JP | 11-186273 | 9/1999 |

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-Jun. 18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of Al to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb.

1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiNAdhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2005, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J. Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between a Diffusion Barrier Layer and a Seed Layer," Novellus Systems, Inc., U.S. Appl. No. 11/807,178, filed May 24, 2007.

Wu et al., "Deposition of Doped Copper Seed Layers Having Improved Reliability," Novellus Systems, Inc., U.S. Appl. No. 12/122,118, filed May 16, 2008.

U.S. Office Action mailed Jun. 26, 2008, from U.S. Appl. No. 11/473,618.

U.S. Office Action mailed May 2, 2008, from U.S. Appl. No. 11/558,693.

Notice of Allowance and Fee Due mailed Nov. 24, 2008, from U.S Appl. No. 11/558,693.

Allowed Claims from U.S Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S. Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

U.S. Office Action mailed on May 26, 2009 for U.S. Appl. No. 11/564,222.

U.S. Final Office Action mailed Jun. 17, 2009 for U.S. Appl. No. 11/701,984.

U.S. Office Action mailed Aug. 3, 2009 for U.S. Appl. No. 11/714,465.

Shaviv et al., "Conformal Films on Semiconductor Substrates" Novellus Systems, Inc., U.S. Appl. No. 12/467,200, filed May 15, 2009.

Notice of Allowance, mailed Sep. 18, 2009 for U.S. Appl. No. 11/903,487.

U.S. Office Action for U.S. Appl. No. 12/154,984, mailed Oct. 6, 2009.

D'Couto et al. J. Vac. Sci. Technol. B. 2001, 19(1), pp. 244-249.

U.S. Office Action mailed Dec. 12, 2008, from U.S. Appl. No. 11/714,465.

U.S. Office Action mailed Jul. 23, 2009 for U.S. Appl. No. 12/122,118.

U.S. Final Office Action for U.S. Appl. No. 11/588,586 mailed Nov. 4, 2009.

Rozbicki et al., "Multistep Method of Depositing Metal Seed Layers" Novellus Systems, Inc., U.S. Appl. No. 12/699,738, filed Feb. 3, 2010.

U.S. Office Action mailed Feb. 4, 2010 for U.S. Appl. No. 11/807,179.

U.S. Office Action mailed Mar. 2, 2010 for U.S. Appl. No. 11/807,182.

U.S. Office Action mailed Mar. 5, 2010 for U.S. Appl. No. 11/807,178.

U.S. Notice of Allowance mailed Mar. 8, 2010 and Allowed Claims for U.S. Appl. No. 11/714,465.

U.S. Final Office Action mailed Mar. 11, 2010 for U.S. Appl. No. 12/122,118.

U.S. Final Office Action mailed Apr. 15, 2010 for U.S. Appl. No. 12/154,984.

U.S. Office Action mailed May 12, 2010 for U.S. Appl. No. 11/807,183.

Danek et al., "Barrier First Method for Single Damascene Trench Applications," Novellus Systems, Inc., U.S. Appl. No. 12/764,870, filed Apr. 21, 2010.

Notice of Allowance and Allowed Claims mailed Mar. 24, 2010, for U.S. Appl. No. 11/588,586.

U.S. Office Action mailed Jul. 30, 2010 for U.S. Appl. No. 12/122,118.

Notice of Allowance mailed Jul. 27, 2010 and Allowed Claims for U.S. Appl. No. 11/807,179.

U.S. Final Office Action mailed Sep. 14, 2010 for U.S. Appl. No. 11/807,182.

Notice of Allowance mailed Sep. 27, 2010 and Allowed Claims for U.S. Appl. No. 11/807,178.

Notice of Allowance mailed Nov. 1, 2010 and Allowed Claims for U.S. Appl. No. 11/807,183.

U.S. Office Action mailed Nov. 12, 2010 for U.S. Appl. No. 11/830,777.

U.S. Final Office Action mailed Nov. 15, 2010 for U.S. Appl. No. 12/122,118.

Notice of Allowance mailed Nov. 30, 2010 and Allowed Claims for U.S. Appl. No. 11/807,182.

Pradhan et al., "Method and Apparatus for Increasing Local Plasma Density in Magnetically Confined Plasma," Novellus Systems, Inc., U.S. Appl. No. 13/033,349, filed Feb. 23, 2011.

Pradhan et al., "Atomic Layer Profiling of Diffusion Barrier and Metal See Layers," Novellus Systems, Inc., U.S. Appl. No. 12/910,623, filed Oct. 22, 2010.

U.S. Final Office Action mailed Apr. 15, 2011 for U.S. Appl. No. 11/830,777.

U.S. Office Action for U.S. Appl. No. 12/764,870 mailed Apr. 14, 2011.

Notice of Allowance mailed Jun. 27, 2011 for U.S. Appl. No. 11/830,777.

Allowed claims as of Jun. 27, 2011 for U.S. Appl. No. 11/830,777.

Notice of Allowance mailed May 25, 2011 for U.S. Appl. No. 12/122,118.

Allowed claims as of May 25, 2011, for U.S. Appl. No. 12/122,118.

U.S. Office Action mailed Aug. 9, 2011 for U.S. Appl. No. 11/977,355.

CN patent application 1567548, English abstract, Jan. 2005.

* cited by examiner

CONFORMAL FILMS ON SEMICONDUCTOR SUBSTRATES

CROSS-REFERENCE TO RELATED APPLICATIONS

This application is a continuation-in-part claiming priority under 35 USC 120 from U.S. patent application Ser. No. 11/807,179 filed May 24, 2007, (now U.S. Pat. No. 7,842,605, issued Nov. 30, 2010), titled "Atomic Layer Profiling of Diffusion Barrier and Metal Seed Layers", naming Pradhan et al. as inventors, which is a continuation-in-part of U.S. patent application Ser. No. 11/588,586 filed Oct. 26, 2006(now U.S. Pat. No. 7,781,327, issud Aug. 24, 2010), titled "Resputtering Process for Eliminating Dielectric Damage", naming Kailasam et al. as inventors, which is a continuation-in-part of U.S. patent application Ser. No. 10/804,353 filed Mar. 18, 2004 (now U.S. Pat. No. 7,186,648 issued Mar. 6, 2007), titled "Barrier First Method For Single Damascene Trench Applications," naming Rozbicki et al. as inventors, which is a continuation-in-part of U.S. patent application Ser. No. 10/412,562 filed Apr. 11, 2003 (now U.S. Pat. No. 6,764,940, issued Jul. 20, 2004) titled "Method For Depositing A Diffusion Barriers For Copper Interconnect Applications," naming Rozbicki and Danek as inventors. This application is also a continuation-in-part claiming priority under 35 USC 120 from U.S. patent application Ser. No. 12/074,168 filed Feb. 29, 2008(now U.S. Pat. No. 7,745,332, issued Jun. 29, 2010), titled "PVD-based Metallization Methods for Fabrication of Interconnections in Semiconductor Devices", naming Shaviv et al. as inventors. Each of these references is incorporated herein by reference in its entirety for all purposes.

TECHNICAL FIELD

The present invention pertains to methods of resputtering layers of material on a partially fabricated integrated circuit. The methods are particularly useful for sputter etching diffusion barrier layers and copper seed layers. The methods can also be applied for sputter etch back of other wafer materials, such as conductive lines.

BACKGROUND

Miniaturization of integrated circuit (IC) devices demands superior electrical properties from both dielectric and conductive materials used in the manufacturing of an integrated circuit. Dielectric materials with low dielectric constant (low-k and ultra low-k dielectrics) have replaced the traditionally used silicon dioxide as an inter-layer dielectric (ILD) material, while copper has replaced aluminum as a conducting material in many applications due to its lower resistivity. The low-k dielectric materials used in the IC device processing include carbon doped silicon dioxide, hydrogenated silicon oxycarbides (SiCOH), fluorine doped silicon dioxide, and organic-containing low-k dielectrics. These materials, due to their low dielectric constants, provide low parasitic capacitance and minimize the "crosstalk" between the interconnects in an integrated circuit. At the same time, they are often porous foam-like materials and are generally more easily damaged during the processing steps than silicon dioxide.

Currently used IC fabrication processes often include operations that remove or redistribute material on a wafer surface using ions generated in plasma. These operations are often referred to as sputter etching or resputtering. In such methods, positively charged inert gas ions or metal ions impinge on a negatively biased substrate and remove or redistribute portions of exposed material residing on a wafer substrate. Examples of materials that can be removed or redistributed using sputter etching and resputtering include diffusion barrier materials, such as Ta and $TaN_x$, and seed layer materials, such as copper and its alloys. These materials usually reside on a layer of a low-k dielectric, which in traditionally used methods is not exposed to plasma during resputtering.

SUMMARY

As semiconductor feature sizes continue to shrink, the manufacturing challenges extend to deposition as well as etching. The present invention provides advanced deposition processes for barrier layers, seed layers, and even in some embodiments, fill material. As cavity widths (also referred to as feature sizes) decrease to below 100 nm, deposition of conformal and continuous layers inside such cavities using existing technologies becomes more difficult. For example, excessive material may be deposited on a field region, while side walls of particularly small features may get inadequate coverage. Material may also form overhangs around openings of features.

In certain embodiments, deposition-type profiling involves etching some of the previously deposited material from regions where deposition is not desirable but could not have been avoided, such as a field region and bottoms of the features. Some or all of the etched materials may be then re-deposited in other more desirable regions, such as side walls of the features. This resputtering process employed in deposition operations is described in detail elsewhere herein. While this technique may improve layer's uniformity, continuous and aggressive etching required to remove substantial amounts of materials can be damaging to underlying conductive features or semiconductor devices and to the dielectric material. A deposited layer may have certain areas that may be thinner and/or more susceptible to etching than others. Prolonged etching during resputtering may completely remove the deposited layer in these areas and expose the underlying material and/or dielectric, which can be later contaminated. For example, resputtering of a copper seed layer may result in etching through both the seed and underlying diffusion barrier layers and expose the dielectric to copper during subsequent line filling. Porous "ultra low-k" (ULK) dielectric materials that have lower hardness and modulus are particularly susceptible to such damage. However, the non-porous dielectrics may also benefit from the proposed methods.

Certain embodiments involve deposition using a series of cycles, each including both deposition and etching operations. In specific embodiments, this series of cycles has at least two cycles with different process parameters. The difference may be exhibited in successive deposition cycles, successive etching cycles, or both. In such embodiments, the atomic layer profiling (ALP) process described herein is said to be "graded" and the overall process is sometimes termed graded ALP.

By dividing the deposition operation into a series of carefully controlled deposition/etch cycles, one can reduce severity of etching in each of the cycles in comparison to etching used in a traditional resputtering. This approach allows one to minimize the risk of damaging the dielectric, especially when the deposited layer is still thin. As result, the process has a more flexible process control, which widens a process window. Deposited layers are generally more conformal and continuous than ones produced using more conventional resputtering.

According to certain embodiments, a layer of diffusion barrier or seed material is deposited on a semiconductor substrate having a recessed feature. The method may include a series of new deposition cycles, for example, a first net deposition cycle and a second net deposition cycle. The first net deposition cycle includes depositing a first deposited amount of the diffusion barrier or seed material and etching a first etched amount of the diffusion barrier or seed material. A thickness of the first deposited amount may be between about 20 and 100 Angstroms. The second net deposition cycle including depositing a second deposited amount of the diffusion barrier or seed material and etching a second etched amount of the diffusion barrier or seed material. A thickness of the second net deposition amount may be between about 5 and 50 Angstroms. The first deposited amount is greater than the second deposited amount in these embodiments.

In certain embodiments, the method includes between about 2 and 20 net deposition cycles. For example, the method may include a third net deposition cycle, which may not necessarily immediately follow the second cycle. For example, there may be several other cycles between the second and the third cycle. A third deposited amount of the diffusion barrier or seed material is deposited during this cycle. The third deposited amount may be less than the first deposited amount, and it may be less than the second deposited amount. In this example, deposited amounts are may decreased from one cycle to another.

The etched amounts in the first and second net deposition cycles may be about the same. Alternatively, the first etched amount may be less than the second etched amount. Further, the net deposition amount (i.e., a difference between the deposited amount and the etched amount in a cycle) of the first cycle may be greater than the net deposition amount of the second cycle.

An etching operations may be characterized with etch rate to deposition rate (etching E/D) ratio that result in an etching operation and/or bias that is applied to the substrate during such operation. An etching E/D ratio and etching bias of the first net deposition cycle are referred to as the first etching E/D ratio and first etching bias. Similarly, an etching E/D ratio and etching bias of the second net deposition cycle are referred to as the second etching E/D ratio and second etching bias. In certain embodiments, the first etching E/D ratio is less than the second etching E/D ratio. For example, the first etching E/D ratio may be between about 1 and 2 and the second etching E/D ratio is between about 1.5 and 4. In the same or other embodiments, no bias is applied to the semiconductor substrate during etching of the first net deposition cycle or the second net deposition cycle. In other embodiments, the first etching bias is less than the second etching bias.

According to certain embodiments, a method is performed in such a way that the first deposited amount is approximately the same as the second deposited amount, while the first etched amount is greater than the second etched amount. The first etching E/D ratio may be less than the second etching E/D ratio. In the same or other embodiments, the first etching bias is less than the second etching bias.

According to other embodiments, a method is performed in such a way that the first deposited amount is approximately the same as the second deposited amount, and the first etched amount is approximately the same as the second etched amount, while the first etching E/D ratio is less than the second etching E/D ratio. The first etching bias may be less than the second etching bias.

Any of the above methods may be performed in an apparatus for depositing a layer of diffusion barrier or seed material on a semiconductor substrate. The apparatus may include a process chamber having a target that includes the diffusion barrier or seed material for depositing onto the semiconductor substrate and a substrate support for holding the substrate in position during deposition of the diffusion barrier or seed material. The apparatus may also include a controller that includes program instructions for performing operations described above.

In certain embodiments, both the first net deposition cycle and the second net deposition cycle are performed in a plasma vapor deposition (PVD) process chamber. For example, both cycles may be performed in a process chamber comprising a hollow cathode magnetron.

The method described above may be used to deposit various diffusion barrier materials and seed materials on different semiconductor substrates. For example, the substrate may be a low-k, an ultra low-k dielectric, or a porous dielectric. The diffusion barrier material may be Ta, $TaN_x$, Ti, $TiN_x$, W, $WN_x$, Ru, Mn, or Co. In certain embodiments, the seed material may be copper or aluminum.

These and other features and advantages of the present invention will be described in more detail below with reference to the associated drawings.

DETAILED DESCRIPTION EXAMPLE EMBODIMENTS

Plasma etch-back (resputtering) of metal-containing materials on a wafer is performed using a plurality of atomic layer profiling (ALP) cycles. Each cycle includes a net etch operation and a net deposition operation. Small amounts of material are etched and deposited in each operation, resulting in a net etch-back which could be performed incrementally, often with an atomic scale control. Several benefits can be achieved with the use of this method. First, it was discovered that plasma etching that employs alternating etching and depositing operations can be used to remove metal-containing materials from the wafer surface in the presence of an exposed dielectric without causing microtrenching in a dielectric. Further, it was noted that improved overhang clipping can be achieved with this method compared to a one-step resputtering. Also, profiling cycles described herein can be used to improve the shapes of recessed features, making them more rounded at the bottom. Provided methods can also be used to improve material coverage at the bottom corners of the recessed features. As a result, integrated circuit devices having improved reliability are fabricated.

Atomic layer profiling methods can be integrated into the process flows for deposition of diffusion barrier materials and seed layer materials to replace previously used one-step resputtering. ALP methods can be used to remove material from a via bottom in a dual Damascene anchoring process, to redistribute material within a recessed feature (e.g., from a feature bottom to a feature sidewall), and to remove excess material from overhangs at the recessed feature openings.

In order to frame the context of this invention, a brief description of a copper dual Damascene process for forming a partially fabricated integrated circuit is described below. The presented methods are not limited to a dual Damascene process and can be used in other processing methods, e.g., in single Damascene processing. While provided methods are particularly advantageous for processing substrates having narrow recessed features with widths of about 65 nm and less (e.g., about 45 nm), they can be equally applied to processing of substrates having wider recesses.

Figure 1A:
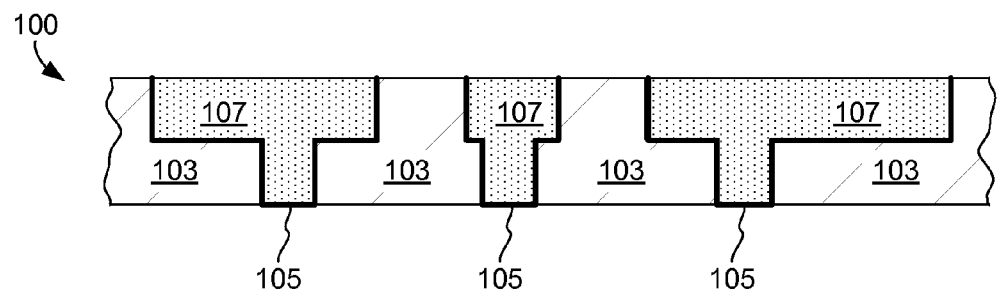
FIGS. 1A-1H show cross sectional depictions of device structures created during a copper dual Damascene fabrication process.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. The substrate 100 may reside on a layer carrying active devices, such as transistors. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by copper seed layer deposition and an inlay with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process. ALP methods described herein can be used to perform resputtering integrated into the deposition process of layer 105, if needed.

Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed, in some embodiments, using ALP methods described herein.

After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
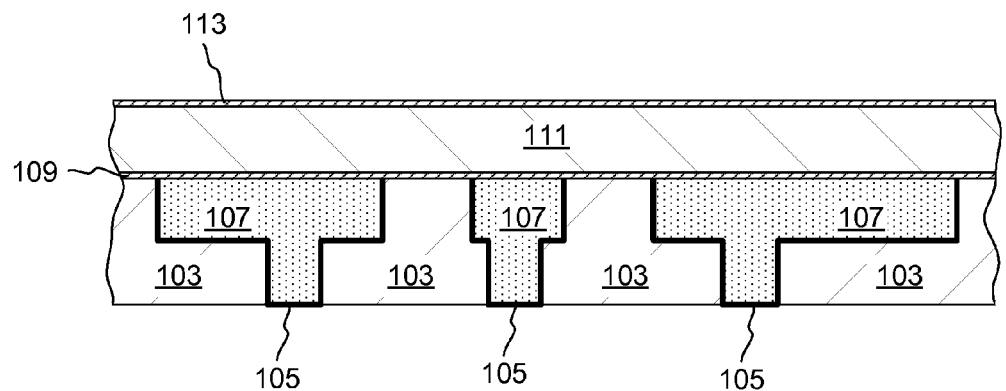

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
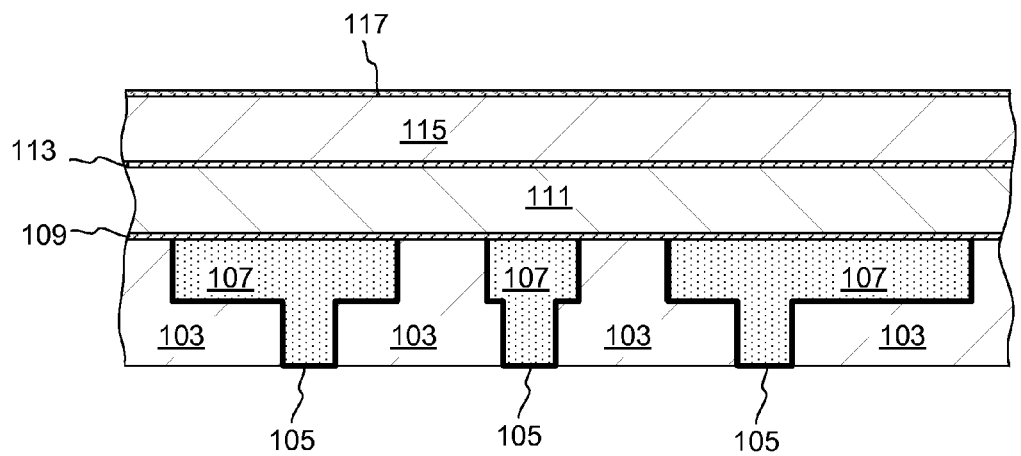

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
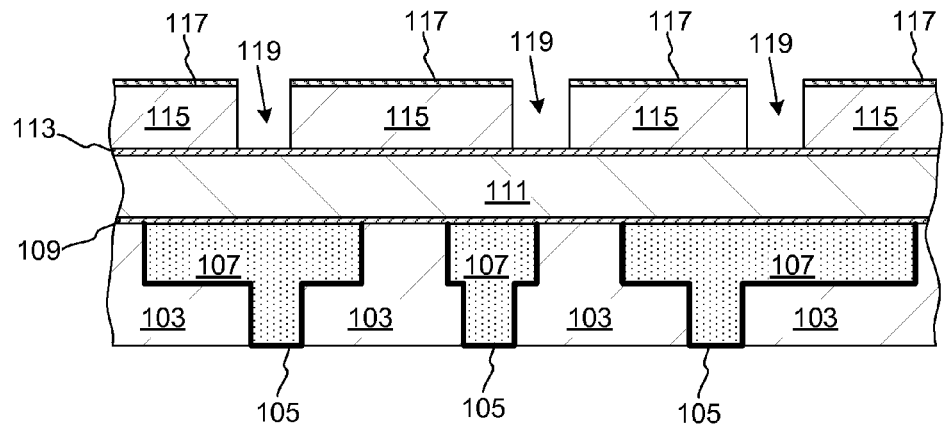
Figure 1E:
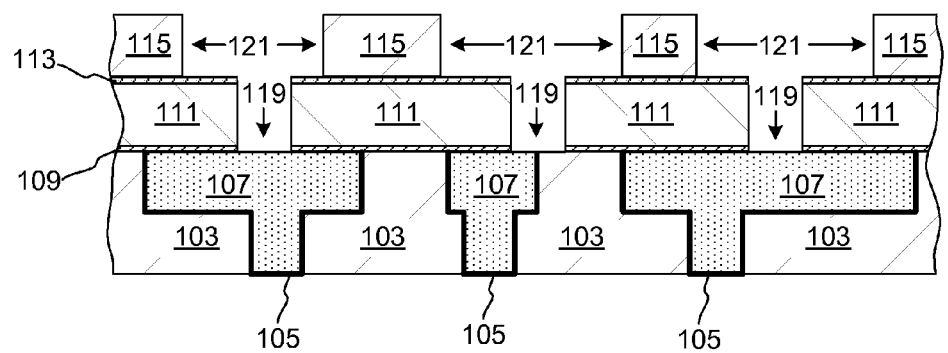

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
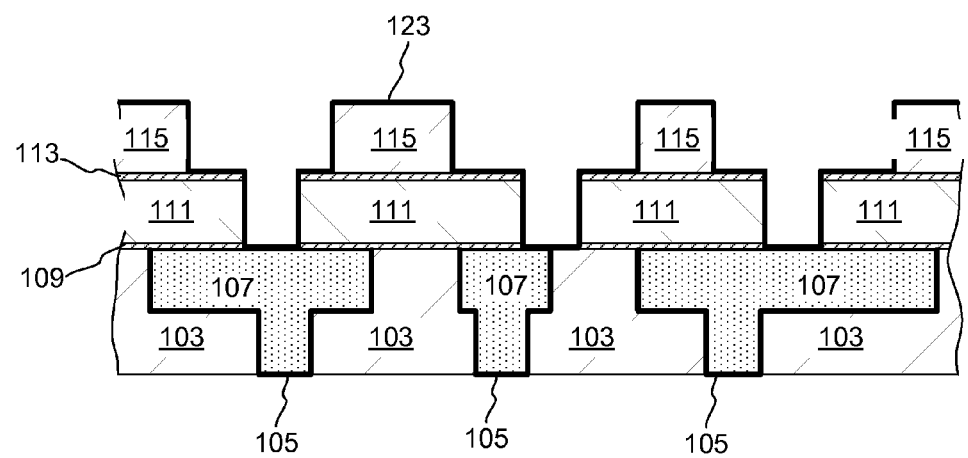

Next, as depicted in FIG. 1F, these newly formed vias and trenches are coated with a diffusion barrier 123. The barrier 123 is made of tantalum, or other materials that effectively block diffusion of copper atoms into the dielectric layers. The methods provided herein can be integrated into deposition process flows for a diffusion barrier 123. Example deposition process flows that can make use of the methods provided herein are described in detail in U.S. Pat. No. 6,607,971, issued Aug. 19, 2003 naming Rozbicki et al as inventors, U.S. Pat. No. 6,764,940, issued Jul. 4, 2004 naming Rozbicki et al. as inventors, U.S. Pat. No. 7,186,648, issued Mar. 6, 2007 naming Rozbicki et al. as inventors, and in U.S. patent application Ser. No. 11/588,586, filed Oct. 26, 2006 naming Kailasam et al as inventors. U.S. Pat. Nos. 6,607,971, 6,764,940, 7,186,648, and the U.S. patent application Ser. No. 11/588, 586 are herein incorporated by reference in their entireties and for all purposes.

An anchoring process that involves removing a portion of metal from underlying metal lines 107 in conjunction with barrier layer deposition is often performed to increase the reliability of formed interconnects. This process will be described in detail in the following sections After the diffusion barrier 123 is formed, a seed layer 125 is deposited on top of the diffusion barrier layer (by a PVD, CVD or an ALD process) to enable subsequent electrofilling of the features.

Figure 1G:
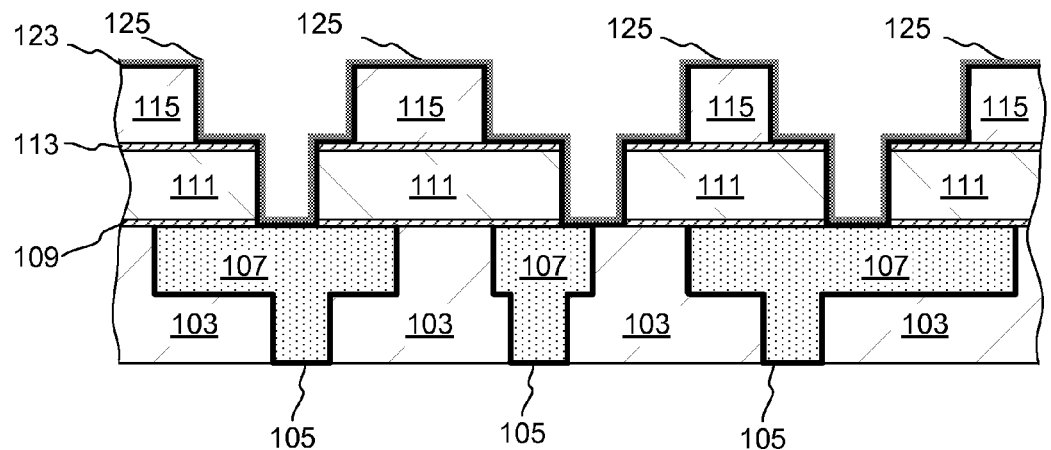
Figure 1H:
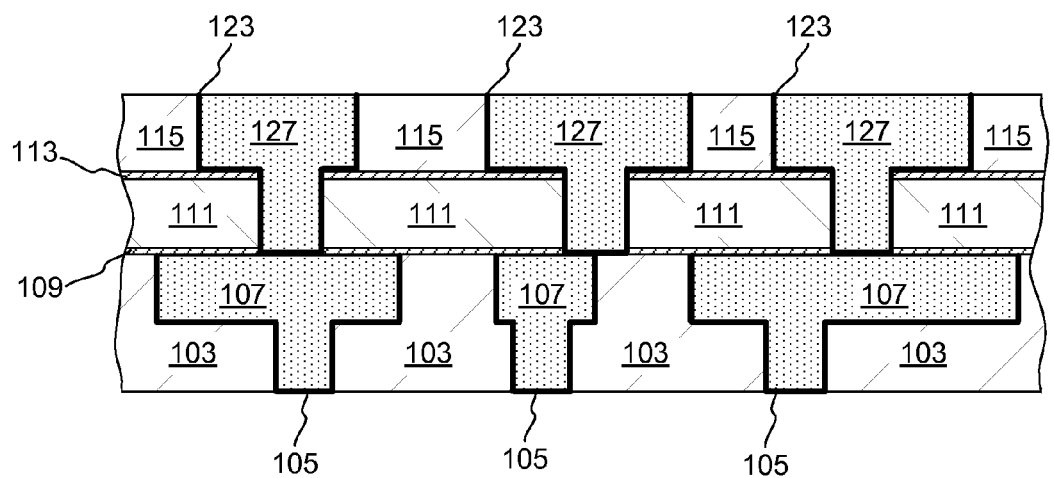

FIG. 1G depicts a copper seed layer 125 deposited on top of the diffusion barrier layer 123. The seed layer should preferably be continuous and should conformally coat the recessed features in order to support an electrofill process. Some process flows for depositing copper seed layers include plasma etch-back operations designed to achieve conformal seed layer coverage within the features. In such processes, ALP methods described herein can be used to effect material etch-back and redistribution. An example process flow that includes resputtering in a copper seed deposition context is described in the U.S. patent application Ser. No. 11/701,984 filed Feb. 1, 2007 naming Rozbicki et al. as inventors.

After the seed layer has been deposited, the recesses are electrofilled with copper. During electrodeposition of copper, the seed layer residing on the wafer serves as a cathode with an electrical contact being made at the edge of the wafer. After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive.

The methods provided herein can be used for resputtering metal-containing materials in a variety of structures. For example, barrier material 105 residing at the contact vias can be resputtered using provided ALP methods. Barrier material 123 coating the landed and unlanded vias in the dual Damascene region can also be resputtered using ALP cycles. Provided methods are particularly advantageous for performing anchoring in dual Damascene structures, since anchoring process often inadvertently exposes dielectric layers to resputtering plasma.

A brief overview of PVD and resputter will now be provided.

During deposition in a plasma PVD apparatus, the wafer substrate is placed into the process chamber, which is configured for plasma generation. The process chamber includes a metal target which accepts a negative DC bias and serves as a source of metal flux during deposition, a wafer pedestal which holds the wafer in position during material processing and which also provides temperature control of the wafer, an inlet for introduction of an inert gas, and one or several magnets for confining the plasma in the proximity of the target. A RF bias can be optionally applied to the wafer. When net deposition of material is desired, typically no bias or only a small bias is applied to the wafer. After the wafer substrate is secured on the wafer pedestal, and the inert gas (e.g., argon) is introduced into the chamber, the plasma is ignited by applying a DC power to the target and confining the plasma with the use of magnetic field in the proximity of the target. Argon is positively ionized in a plasma to form $Ar^+$ ions which impinge on a negatively charged target with a sufficient momentum to dislodge metal atoms from the target. The neutral metal atoms dislodged from the target can be further ionized in a plasma. The metal species including neutral and ionized metal are being sputtered from the target onto the wafer and deposit on its surface.

When larger RF bias is applied to the wafer, the positively charged argon ions and metal ions may acquire sufficient energy at the wafer surface to impinge upon the wafer with a sufficient momentum to dislodge material from the wafer surface causing etching (resputter). Atoms of the etched material may be permanently removed from the wafer, or may be redistributed from one position on the wafer to a different position. For example, material may be redistributed from the bottom of the via to the via sidewalls. Typically, etching and depositing processes are occurring simultaneously in the PVD chamber. Etching is affected by the inert gas ions and, in some cases, by metal ions, impinging on the wafer with a sufficient momentum to dislodge the exposed material, while deposition is effected by neutral metal atoms and, in some cases, by metal ions, being sputtered onto the wafer from the target. When an intrinsic etch rate E is greater than the intrinsic deposition rate D, a net etching process is occurring on the wafer surface. When the etch rate E is smaller than the deposition rate D, the process is characterized as a net deposition.

An etch rate to deposition rate ratio is often used to characterize the resputtering and deposition processes. At the E/D ratio of 1, no net deposition or etching is occurring. At the E/D ratio of 0, the process is entirely depositing. At E/D ratios of greater than 1 etching predominates, this being characteristic of resputter. The E/D ratio is not necessarily the same in different features of the wafer. For example, the E/D ratio in the field, in the trench, and in the via may have different values. For example, it is possible to have net deposition in the field region (E/D<1) and net etch at the via bottom (E/D>1). The resputtering process can be described as a process that provides an E/D>1 at least at one location on the wafer, e.g., at a via bottom, at the lowest lying feature on the wafer or in some cases in the feature having the highest aspect ratio. The fact that a net deposition is occurring at a different location on the wafer, e.g., in the field, does not change the fact that resputtering is performed. An E/D ratio can be modulated by modulating the process parameters, such as the DC power applied to the target and the RF power applied to the wafer. The intrinsic deposition rate D is typically increased as the DC power to the target increases, because larger amounts of metal species are being sputtered from the target. An intrinsic etch rate E is typically increased as the RF power at the wafer increases, since it results in higher energy of inert gas ions and/or metal ions impinging on the wafer. Therefore E/D ratio can be increased by increasing the RF(wafer)/DC(target) power ratio.

As described net etching and net deposition can be performed in one process chamber and can be controlled by process parameters such as power levels applied to the wafer and the target, pressure in the process chamber, strength of magnetic fields, etc.

For the etchback (resputter) step the combination of DC power applied to the target and RF power applied to the wafer has to ensure the net material removal from the wafer. For example, for HCM modules having target areas of between about 1000-6000 $cm^2$, DC power should be in the range from 1 kW to 10 kW or as low as 0 for the pure etching. One of skill in the art will understand that this range depends on the target area, and can be different for smaller or bigger targets especially if the method is used with the different source/target design. The RF power may be between about 100 W to 3000 W for a typical substrate (e.g., a 300 mm wafer). This range depends on the wafer area and can be much greater for applications that deal with big substrates. In terms of power density (independent of the target area or substrate area), examples of suitable DC power ranges for the sputter etch operation are range from about 0 W/($cm^2$ target) to 5 W/($cm^2$ target) and for the RF power, from about 0.1 W/($cm^2$ substrate) to 5 W/($cm^2$ substrate).

For the net deposition process the DC power can range from about 5 W/($cm^2$ target) to 25 W/($cm^2$ target), and, for the RF power, from about 0 W/($cm^2$ substrate) to 0.5 W/($cm^2$ substrate). PVD deposition is described in U.S. Pat. Nos. 6,905,959; 6,773,571; and 6,642,146, which patents are hereby incorporated by reference and for all purposes.

FIGS. 2A-2D illustrate problems associated with an anchoring process performed using a one-step resputtering. These problems include dielectric microtrenching and inadequate diffusion barrier coating at the bottom corners of an anchor recess.

Figure 2A:
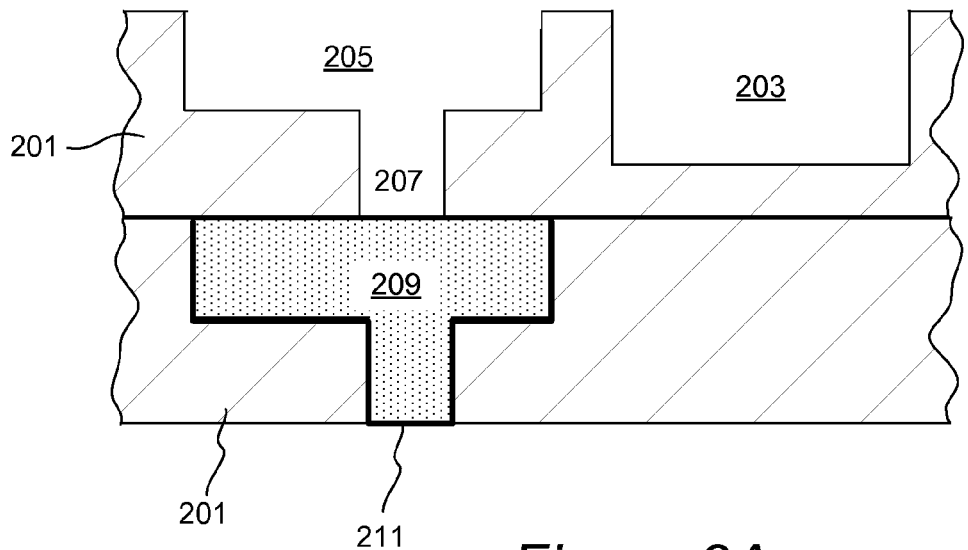
FIGS. 2A-2D show cross sectional depictions of device structures obtained during anchoring in a dual Damascene process. Microtrenching in a dielectric is illustrated.

It is often desirable to use resputter for etching through the via into the underlying copper line. The sequence of wafer processing steps resulting in such punch-through etching is depicted in FIGS. 2A-2D. Referring to FIG. 2A, a cross-sectional depiction of a wafer substrate is shown. The substrate comprises two layers of dielectric 201, where the top layer is patterned with three recesses, a lower-lying trench 203, a higher-lying trench 205 and a via 207. The lower-lying trench 203 is also a higher aspect ratio trench. The dielectric 201 may be a low-k dielectric such as carbon doped silicon dioxide, hydrogenated silicon oxycarbide (SiCOH), fluorine doped silicon dioxide, or organic-containing low-k dielectric. A conductive line 209 resides in the underlying dielectric layer directly below the via 207. Conductive lines are most commonly copper lines. The sides and the bottom of the copper line are coated with a diffusion barrier layer 211, which prevents the diffusion of copper into the dielectric layer 201. Etch-stop and antireflective layers, such as 113 and 117 of FIG. 1C, are not shown for clarity reasons.

Figure 2B:
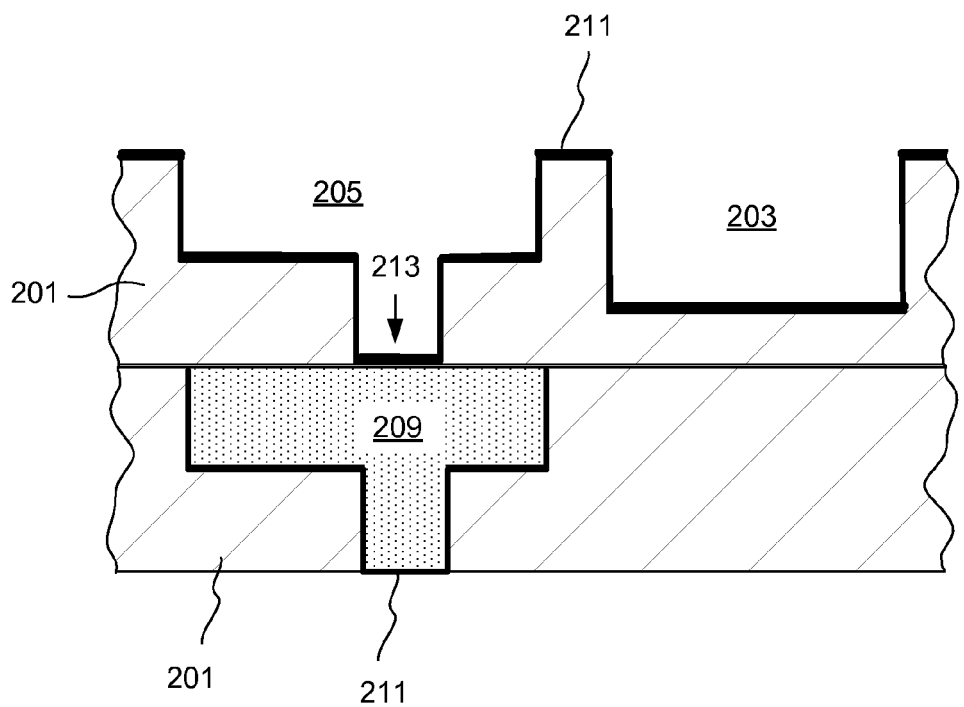

The exposed top dielectric layer is then subjected to a diffusion barrier deposition step resulting in the structure shown in FIG. 2B. It can be seen that after the deposition step, diffusion barrier layer 211 covers the surface of top dielectric layer both in the field and in the recesses. The uniformity of such coverage, however, is low, particularly in the via region. There is significant accumulation of the barrier material in the via bottom 213, and a very thin coverage of the via sidewalls. Uniformity of the via coverage is improved through the resputter step in which material residing at the via bottom is resputtered onto the via sidewalls.

When resputtering is performed further, it etches material of the copper line 209 residing below the via leading to formation of a cavity in the conductive line, known as an anchor recess. In a conventional process about 50 Å of tantalum and up to about 500 Å of copper were etched in a single resputtering step.

Figure 2C:
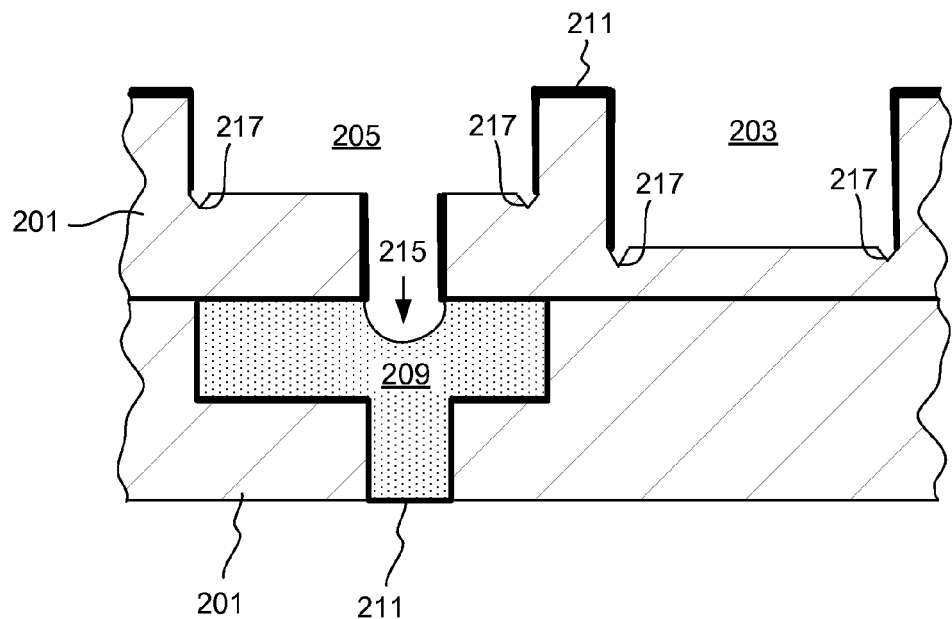

The structure with an anchor 215 is shown in FIG. 2C. The anchor is a desired feature in the fabrication of an IC device since it would result in a mechanically strong interconnect when the via is filled with metal. At the same time, resputtering leads to undesired and unintentional changes in the trench region. The bottom of the trench is stripped of the barrier layer, and the dielectric becomes exposed to the impact of high-energy ions. In particular, dielectric layer in lower-lying trenches, such as in the trench 203 becomes easily exposed, because little etching selectivity exists between a via 207 and lower-lying trench 203.

Further resputtering of an exposed dielectric in the trench, especially in a high E/D mode leads to a microtrenching problem. Microtrenches 217 are formed at particular spots in the dielectric layer of the trench bottoms, usually in the proximity of the sidewalls. It is believed that reflection of high-energy ions from the trench sidewalls onto particular locations of dielectric in the trench bottom causes increased bombardment of dielectric in these particular sites. The impact of resputtering is, therefore, increased in these spots leading to higher localized etching and formation of microtrenches. This effect is especially pronounced for low-k dielectric, since they are often brittle and easily damaged materials. Microtrenching in silicon dioxide dielectric usually does not occur as readily. Microtrenches can form at any point during the resputtering process when dielectric becomes exposed to argon and/or metal ions. Depending on the relative thickness of the barrier layer in the trench and in the via bottom, the trench bottom dielectric can become exposed in the beginning or at the end of barrier layer resputtering in the via or during the etch-back of copper line during anchor formation.

Microtrenches are viewed as undesired features in IC devices since they contribute to level-to-level current leakage, result in poor adhesion of subsequently deposited layers, and lead to decreased reliability of the integrated circuit.

Figure 2D:
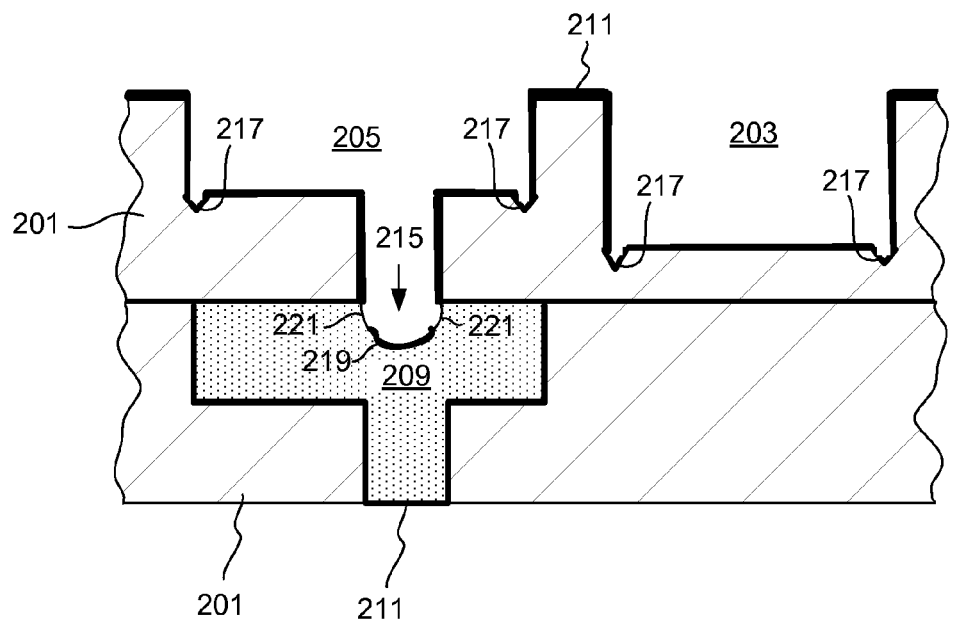

Referring to FIG. 2D, after formation of an anchor recess 215, a flash layer 219 of diffusion barrier material, such as Ta, is deposited on at least the horizontal surfaces of the substrate, e.g., on the trench bottoms, and on the anchor bottom. It was noted, however, that spots having weak or no barrier coverage 221 would form at the bottom corners of an anchor recess. After the vias and trenches are electrofilled with copper, and the complete device is fabricated, these weak spots could lead to electromigration failure in this region.

Both microtrenching and inadequate barrier material coverage in the anchor corners can be eliminated by splitting the single-step resputtering into a plurality of ALP profiling cycles, each cycle having a net deposition operation and a net etch operation. For example, instead of removing 250 Å of copper in a single resputtering operation, the process might include the following sequence: (20 Å Ta deposition–70 Å etch-back)×5 at the feature bottom.

Figure 3A:
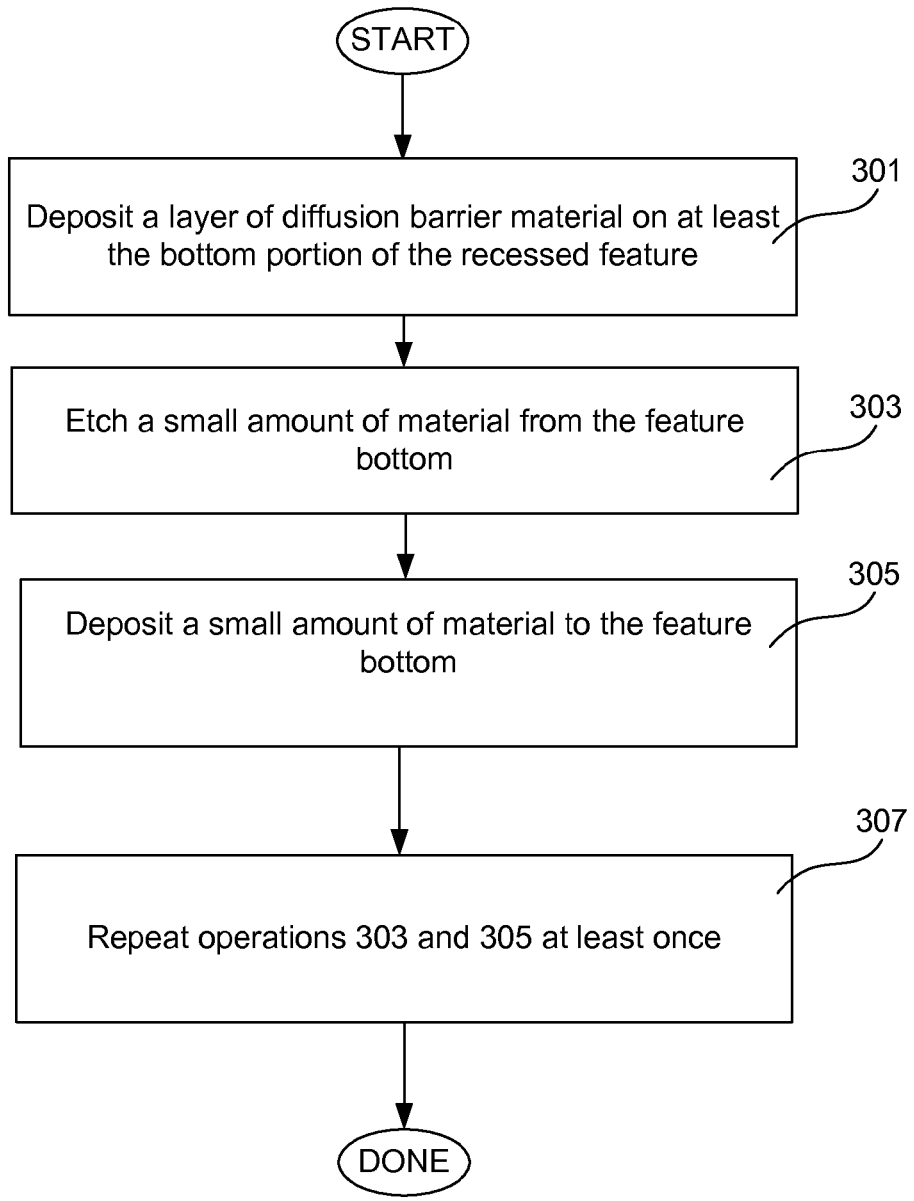
FIGS. 3A-3C present process flow diagrams in accordance with embodiments described herein.

An example process flow diagram for an ALP method is shown in FIG. 3A. The process starts by depositing a layer of diffusion barrier material on at least the bottom portion of the recessed feature in an operation 301. Example diffusion barrier materials that can be deposited include Ta, $TaN_x$, Ti, $TiN_x$, W, $WN_x$, Ru, Co and the like. In general these materials can be deposited by a variety of methods including PVD, ALD, CVD, and PDL. In one implementation, the diffusion barrier material is deposited in a PVD process chamber, and the same process chamber is used for the following ALP cycles. The first ALP cycle starts by etching a small amount of material from the recess bottom by resputter in an operation 303. Preferably, less than about 200 Å, more preferably less than about 100 Å, e.g., between about 5-50 Å of material is removed from the recess bottom by operation 303. Operation 303 may remove a portion of material deposited in 301, all of this material, or all of this material and a small portion of an underlying copper line material. Next, a small amount of material is deposited into the feature bottom in an operation 305. The amount of material deposited in an operation 305 is smaller than the amount of material etched in an operation 303, such that net etching is achieved in at least one, and preferably in all of the profiling cycles. In one embodiment, between about 5-20 Å of material (typically of a diffusion barrier material sputtered from the target in a PVD process) is deposited at the recessed feature bottom. While in many embodiments it is preferred that net deposition of material occurs in this operation, in other embodiments E/D of about 1 can be achieved at the feature bottom in this step, with material being simultaneously deposited and sputter etched at almost equal rates. One profiling cycle includes operations 303 and 305 and typically achieves removal of between about 5-100 Å, preferably of between about 10-50 Å of material per cycle. Next, a second profiling cycle which includes a net etch and a net deposition operation is performed. Thus the cycles are repeated as shown in 307, until the necessary amount of material is removed from the recessed feature bottom. Note that etch and deposition operations need not necessarily be identical for all of the profiling cycles, and a variation in the amount of etched and deposited material can exist within the guidelines described above. Typically, about 2-10 profiling cycles are sufficient for most purposes. For example a 500 Å deep anchor can be formed by performing 10 profiling cycles, each removing about 50 Å of material (typically a mixture of Ta and Cu) from the bottom of the via in a dual Damascene structure.

Figure 3B:
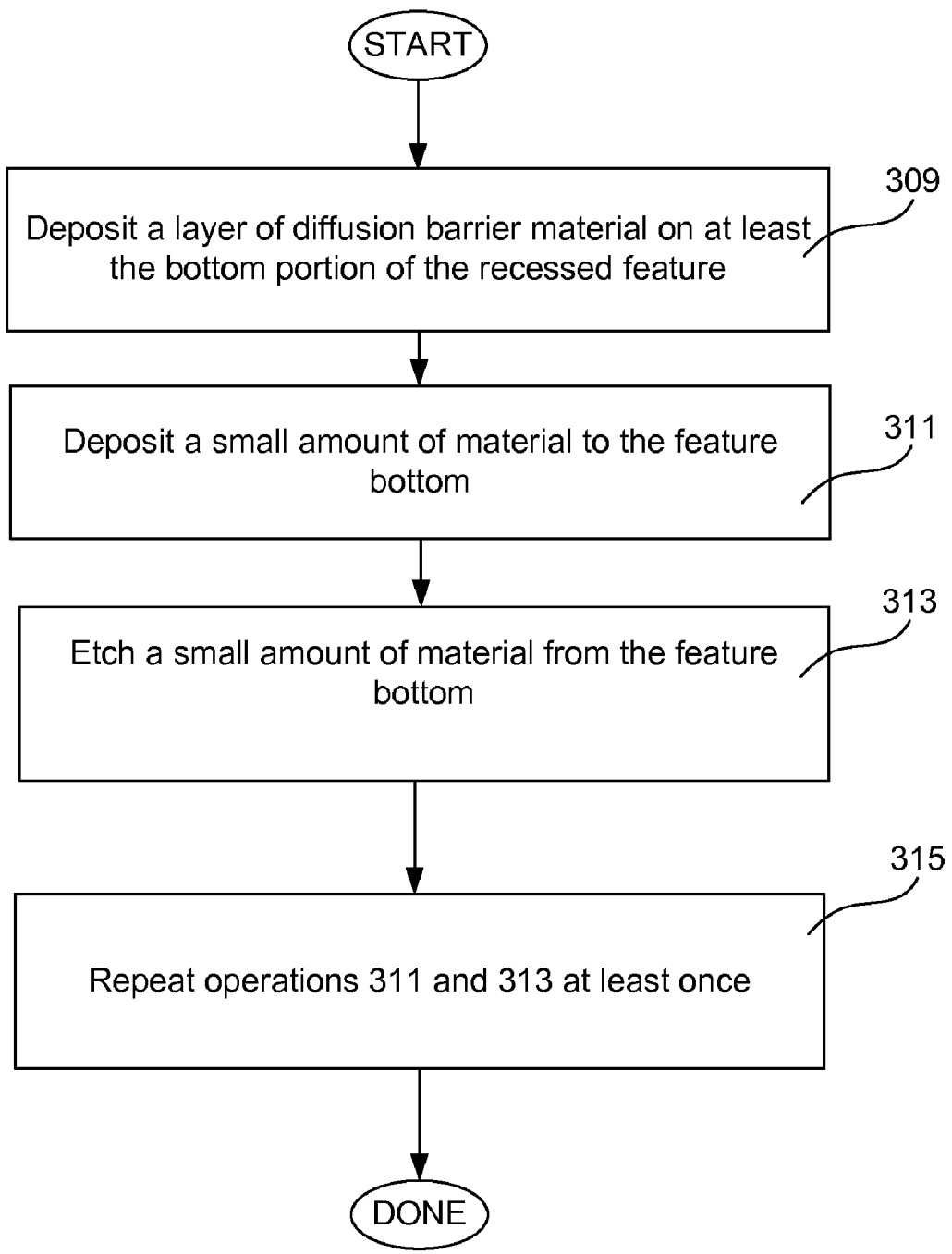

While ALP cycles typically include alternating net depositing and net etching operations, they do not necessarily need to start with an etching operation and end with a depositing operation, as shown in FIG. 3A. FIG. 3B shows a process flow diagram according to another embodiment in which the first ALP cycle starts with a net deposition operation. Referring to FIG. 3B, the process starts by depositing a layer of diffusion barrier material on at least the bottom portion of the recessed feature in 309 (analogously to operation 301 of FIG. 3A). For example a layer of $TaN_x$ is deposited by PVD. Next, the first ALP cycle starts by depositing a small amount of material on at least the bottom portion of the recessed feature in 311. For example, Ta can be deposited from the sputter target by PVD. Next, the deposited material and a portion of underlying metal-containing material (e.g., $TaN_x$) is etched away in an operation 313, thereby completing the first ALP cycle. Operations 311 and 313 are repeated at least once, as shown in 315, until a desired amount of material is removed from the recessed feature bottom. Depending on the requirements of the process, the ALP cycles may end either with a net depositing operation or with a net etching operation.

There is a wide latitude in tailoring the conditions for the etching and depositing operations of ALP cycles to achieve the desired atomic profiling result. In a particular embodiment tailored for an anchoring process, a net etching operation of an ALP cycle has an E/D ratio of greater than 1 both at the bottom of the lowest-lying recess (e.g., a via) and in the field region. Higher E/D ratios are typically preferable in the ALP embodiments designed for anchoring. For example, an E/D ratio of greater than about 2 at a recess bottom and greater than about 1.1 in the field is often preferred in this embodiment, for a net etching operation.

Further, it is often preferred that the net depositing operation of ALP cycles has an E/D ratio of less than 1 both in the field and at the recess bottom. While in some embodiments, the depositing operation used during anchoring may have an E/D ratio of greater than 1 at the via bottom that is being anchored, preferably an E/D ratio of less than 1 should exist at the bottom of the recessed feature having an exposed dielectric layer, e.g., a trench. In some embodiments, the net depositing operation of an ALP cycle deposits between about 5-50 Å, preferably about 10-30 Å of material in the field, and the net etching operation removes between about 5-80 Å of material from the field. Note that net etching rate is typically higher at the via bottoms than at the trench bottoms and is much higher at the via bottoms than in the field. Therefore, net etching of about 80 Å in the field may correspond to net etching of about 125 Å at the via bottom. The net deposition rate is typically higher in the field compared to via bottoms. Therefore, net deposition of about 400 Å in the field may correspond to about 200 Å deposition at the via bottom.

Graded Atomic Layer Deposition Process

The graded ALP process may be used to both deposit a new layer and etch away an existing layer. In both cases, a goal may be to yield a conformal and continuous layer. The difference is that deposition of a new layer includes a series of cycles with the end result being a positive net deposition. In some, though not all processes, the thickness of the layer increases throughout the process. The risk of damaging an underlying material or dielectric is higher early in the process and then gradually declines as the deposited layer gradually thickens.

In embodiments involving net etching of a layer, graded ALP involves etching away an existing layer using a series of cycles with the thickness of such layer generally decreasing throughout the process. As with the graded ALP deposition process, the graded ALP etching process generally utilizes more aggressive etching when the layer is thick. However, these situations (a layer being thin and a layer being thick) occur during different stages of the process. For clarity, only a graded ALP deposition of a new layer is described below. However, it should be understood that the same description may be applied to a graded ALP etching of an existing layer.

Each cycle of the graded ALP process has a specific set of process parameters, which may be varied from one cycle to another. As mentioned, at least one process parameter varies between two successive cycles. Commonly, the parameter is the thickness or amount of etch or deposition. For example, in one cycle a thickness A may be deposited and a thickness B may be etched. Then in a succeeding cycle, a thickness A−x is deposited and a thickness B is again etched. Alternatively, in the succeeding cycle, thickness A is again deposited and a thickness B+y is etched. Other parameters that may be varied between cycles may include the etch to deposition ratio of an etch or deposition operation, the power applied to the target, the bias to the wafer or pedestal, the strength of the magnetic field used to confine the plasma within the chamber, the pressure inside the chamber, the durations of deposition and etching operations, and the like. For consistency, process parameter values are specified for a field region. It should be understood that values are generally different at bottoms of the recessed featured.

In general, a variety of methods including PVD, ALD, CVD, and PDL may be used for the graded ALP. In certain embodiments, all cycles of the graded ALP process are performed in the same process chamber. The described processes may be used for deposition of diffusion barrier and seed materials as well as other materials and/or layers used in semiconductor manufacturing such as copper fill. Examples of diffusion barrier materials include Ta, $TaN_x$, Ti, $TiN_x$, W, $WN_x$, Ru, Co, Mn, and the like. Examples of seed layer materials include copper, copper alloys, aluminum, and the like.

A typical graded ALP process has multiple cycles each including a deposition operation and an etching operation. The number of cycles may be between about 2 and 100 or, in certain more specific embodiments, between about 2 and 20. Process parameters described above differ in at least two cycles.

In certain embodiments, the graded ALP process does not have distinct cycle boundaries with time-separated ending and beginning points. Instead, a "continuous" graded process may provide continuous change of one or more parameters. There may be no clearly distinguishable steps in changes of parameters. For example, a deposition process may start with an increase in a bias and etch rate. The two parameters may be "oscillated" at a certain frequency between minimum and maximum values, which may also change throughout the process. The oscillations may follow a periodic (e.g., sinusoidal) or any other predetermined function. The etched and deposition rates can be varied in a similarly continuous manner. This may be accomplished by, for example, changing the magnetic fields in the deposition chamber so that the kinetic energy and the collision angle of the material with the substrate is controlled and varied continuously.

Figure 3C:
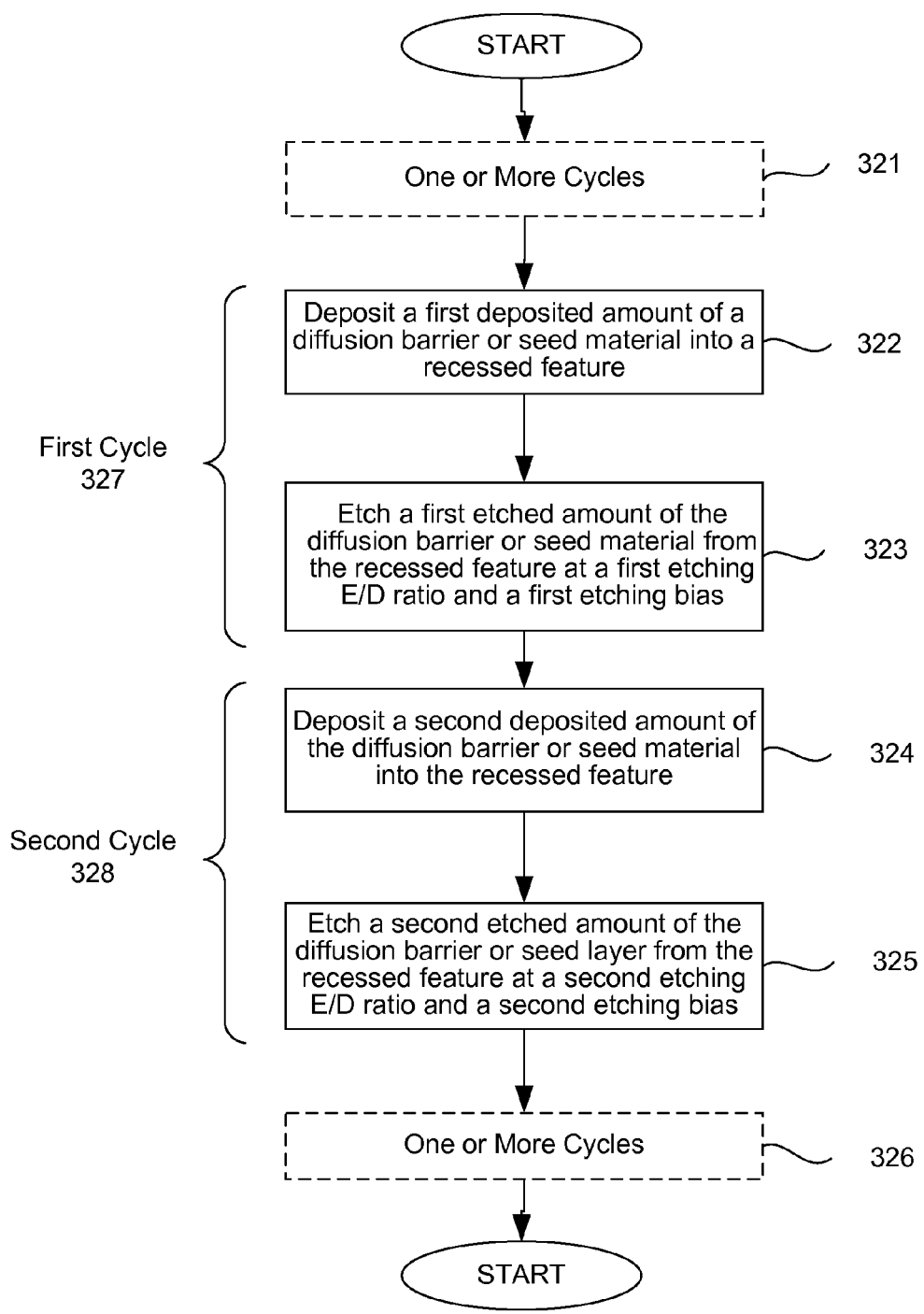

An example process flow diagram is illustrated in FIG. 3C. The process includes a first cycle 327 and a second cycle 328. It should be noted that the naming (e.g., "first" and "second") is used to distinguish between the two cycles. These names do not necessarily specify an order or position of the two cycles within an overall process. There may be additional cycles or other operations (block 321) before the first cycle 327. Further, there may be other cycles and operations (block 326) after the second cycle 325. The process flow diagram illustrates that there is at least one change in one or more process parameters between the first cycle 327 and the second cycle 328. In certain embodiments, a process may involve any number of such changes. For example, each cycle may be associated with a unique set of the process parameters.

According to certain embodiments, other cycles may have process parameters that are similar to the first 327 or the second 328 cycle. For example, a process may have twelve cycles. The first six cycles may have the same process parameters (e.g., the same as in the first cycle 327). The last six cycles also have the same process parameters (e.g., the same as in the second cycle 328). The above example corresponds to a plot illustrated in FIG. 3E.

FIG. 3C illustrates that a process may include at least four operations: 322, 323, 324, and 325, which represent two cycles each with a deposition sub-cycle and an etch sub-cycle. The operation 322 has a corresponding first deposition amount (referred to as a "first deposited amount"). The operation 323 has a corresponding second etched amount (referred to as a "first etched amount") as well as a first etching E/D ratio and a first etching bias. The operation 324 of the next cycle has a corresponding deposition amount (referred to as a "second deposited amount"). The operation 325 of this same cycle has a corresponding etched amount (referred to as a "second etched amount") as well as a second etching E/D ratio and a second etching bias. Of course, the first and second operations include their own E/D ratios and biases. For clarity, certain process parameters, such as bias during deposition operations, are not reflected in FIG. 3C.

Table 1 lists examples illustrating different variations of the above mentioned process parameters.

TABLE 1

| Example | Second Deposited Amount | Second Etched Amount | Second etching E/D ratio | Second etching bias |
|---|---|---|---|---|
| A | <First | ~First | ~First | — |
| B | ~First | >First | ~First | — |
| C | ~First | >First | >First | — |
| D | ~First | ~First | >First | — |
| E | <First | >First | ~First | — |
| F | <First | >First | >First | — |
| G | ~First | >First | >First | Yes (No First) |
| H | ~First | >First | >First | >First |

The first cycle 327 includes a deposition operation 322 and an etching operation 323. The order of the two operations 322 and 323 may differ. For example, the operation 322 may be performed before the operation 323 or vice versa. The order of the operations (sub-cycles) in the first cycle 327 generally determines similar order in the second cycle 328 such that the deposition operations (322 and 324) are alternated with the etching operations (323 and 325).

Process parameters determine the first deposited amount in operation 322. Generally, thicker deposition results from higher DC energy, lower bias, and/or longer duration. A targeted first deposited amount may be established in light of other parameters, such as the first etched amount (in operation 323), the first etching E/D ratio, a thickness of the layer at some reference point (e.g., before operation 322). In certain embodiment, the first deposited amount corresponds to a thickness of at least about 1 Å, or in more specific embodiments, at least about 5 Å. In other embodiments, the first deposition amount corresponds to a thickness of at least about 10 Å, or in more specific embodiments, at least about 20 Å.

The difference between a deposition amount and a corresponding etched amount is sometimes referred to as a net deposition amount for a complete cycle. The net deposition amount is generally higher for initial cycles when the deposited layer is still thin. This explains the relationship between the first deposited amount, the first etched amount, and the thickness of the layer during the first cycle. Additionally, if more aggressive etching (higher first etching E/D ratio) is desired, then the risk of damaging the under layer and dielectric may be mitigated by increasing the first deposited amount.

The first etched amount in operation 323 is also determined by the corresponding process parameters. Generally, more etching results from lower DC energy, higher bias, and longer duration. The first etched amount may be also driven by the first deposited amount (to achieve desired net deposition), the first etching E/D ratio (to control the risk of damaging the under layer and dielectric), a thickness of the layer at some reference point (e.g., before operation 322), and others. In certain embodiments, the first etched amount corresponds to an etched thickness of at less than about 40 Å or, in more specific embodiments, less than about 20 Å.

The first etching E/D ratio is another parameter in operation 323. In certain embodiments, the first etching E/D ratio is between about 1 and 6 or, in more specific embodiments, between about 1.1 and 4, or even between about 1.1 and 2. The first etching may be also between about 1.1 and 1.5, between about 1.2 and 1.3, or about 1.25. An E/D ratio during initial cycles is generally less than in later cycles because the risk of damaging the under layer and dielectric is higher when the deposited layer is still thin. Process parameters that drive an E/D ratio include a bias applied to the substrate, DC power, magnetic field, chamber pressure, and other.

Applying bias generally increases an E/D ratio. Examples A-G in Table 1 indicate that no bias is applied to the semiconductor substrate in operation 323 (i.e., the first etching bias is zero). In Example H, the first etching bias is applied and is less than the second etching bias in operation 325. In certain embodiments that are not shown in Table 1, both the first cycle 327 and the second cycle 328 have the same bias during their etching operations (i.e., the first etching bias is approximately the same as the second etching bias). The first etching bias may be between about 0-1500 W, or more specifically, between about 0-750 W or between about 750-1500 W. In certain embodiments, the first etching bias is between about 0-300 W. It is of course within the scope of this invention to apply some level of bias in one or more of the deposition sub-cycles such as in operations 322 and/or operation 324.

After the first cycle 327, the process proceeds to the second cycle 328. As emphasized above, the second cycle 328 has at least one process parameter that is different from that in the first cycle 327. This establishes the "grading" of the proposed ALP process.

Operation 324 involves depositing a second deposited amount of diffusion barrier or seed material into the recessed feature. In some embodiments, the second deposited amount may be same as the first deposited amount (Examples B-D, G, and H in Table 1). For example, the second deposited amount may be at least about 1 Å, or in more specific embodiments, at least about 5 Å. In other embodiments, the first deposition amount corresponds to a thickness of at least about 10 Å, or in more specific embodiments, at least about 20 Å. In these embodiments, grading is established by varying etched amounts (Example B), by varying both etched amounts and E/D ratios (Example C), or by varying E/D ratios (Example D). For example, the deposited amounts may be the same and between about 20 and 100 Å. The etched amounts may be increased from between about 5 and 20 Å to between about 10 and 30 Å. In another example, both the deposited and etched amount may be constant, for example, between about 20 and 80 Å for deposited amounts and between about 10 and 40 Å for etched amounts. The etching E/D ratio may be changed from between about 1.0-1.5 to between about 1.25-1.75. A multiple changes of the above parameters through out the deposition are possible. For example, the etching ratio may be further increased to between about 1.5-2.0 or to between about 2.0-6.0 in the above examples.

Other examples, where the second deposited amount may be same as the first deposited amount, may include varying both etched amounts and E/D ratios and applying a bias during subsequent etching operations (Example G) or varying etched amounts, E/D ratios, and bias (Example H). Certain other examples are not reflected in Table 1. Such examples may have the first deposited amount about the same as the second deposited amount, while grading is achieved by varying other process parameters exist. It should be understood that the list of examples presented in Table 1 is not exhaustive.

In other embodiments, the second deposited amount may be different than the first deposited amount. In some specific embodiments, the first deposited amount is greater than the second deposited amount (Examples A, F, and G in Table 1). For example, combinations of the first and second deposited amounts (first/second) may include 60-90 Å/40-60 Å and 40-60 Å/10-40 Å. In these embodiments, grading may be established by changing deposition amounts, while maintaining other process parameters described above constant as shown in Example A. Alternatively, grading may be established by changing deposition amounts and etched amounts as shown in Example E. In yet another embodiment presented as Example G in Table 1, a combination of deposition amounts, etched amounts, and E/D ratios during etching may be changed to establish grading.

A combination of the first and the second etched amounts determines a net deposition amount in the second cycle 328. In certain embodiments, the net deposition may be constant across multiple cycles, for example, as shown in Example D. Grading is achieved by varying other process parameters, such as E/D ratios, bias, and, possibly, deposited and etched amounts, while maintaining the same net deposition amount. Further, even if two cycles have the same net depositions, it does not mean that the corresponding deposition and etch amounts of the two cycles are the same. The same net deposition may be maintained, for example, if both the deposition amount and etch amount are increased (or decreased) from other cycle to another by the same amount. Generally, both the net deposition and etched amounts should be consider in mitigating the risk of damaging the under layer and dielectric.

Another process parameter of operation 325 is the second etching E/D ratio. An E/D ratio during an etching operation may vary from one cycle to another independently of the corresponding etched amounts. In certain embodiments, the first etched amount may be about the same as the second etched amount, while the first etching E/D ratio may be less than the second etching E/D ratio 328 as, for example, shown in Example D. The same amount of material may be etched in all or most of the cycles. A first (initial) set of cycles may have a relatively low E/D ratio during the etch phase, for example, between about 1 and 1.5. The E/D is then increased to, for example, between about 1.25 and 1.75 in the second set. The first (final) set has the highest E/D ratio, for example, between about 1.5 and 6.0. There may be additional cycles in this example that are not part of any of the three sets.

Bias may be used in one or more cycles of the process during either deposition and/or etching operations. Bias helps to trim the overhang and, therefore, in certain embodiments, provides a better step coverage and prevent corner clipping at a lower aspect ratio features. For example, initial cycles may be performed without bias in order to avoid damage to the under layer or the dielectric. The bias may be then increase to a mild (e.g., between about 100-500 W) level in order to provide good material distribution inside features and minimize overhang. A subsequent set of cycles may have even higher bias level (e.g., greater than about 500 W) in order to trim the overhangs and prevent pinching off. Finally, one or more final cycles may be performed with minimal or no bias (e.g., less than about 100 W) to ensure good coverage on the horizontal surfaces. All bias values are presented for a 300 millimeter wafer and may be scaled as appropriate for other wafer sizes.

Figure 3D:
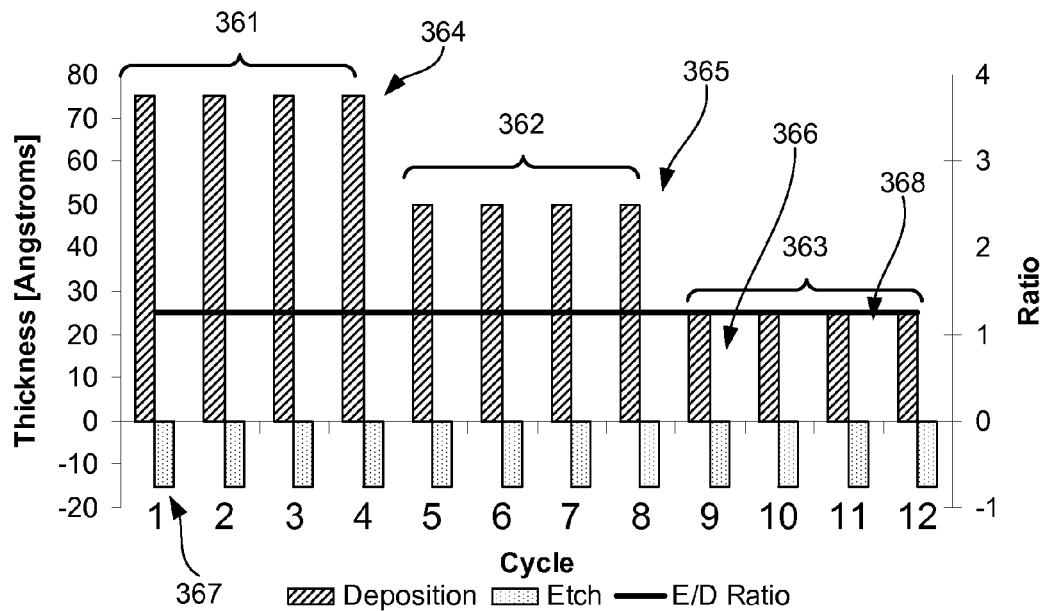
FIGS. 3D-3F illustrate example plots of variable parameters for three different graded ALP processes.
Figure 3E:
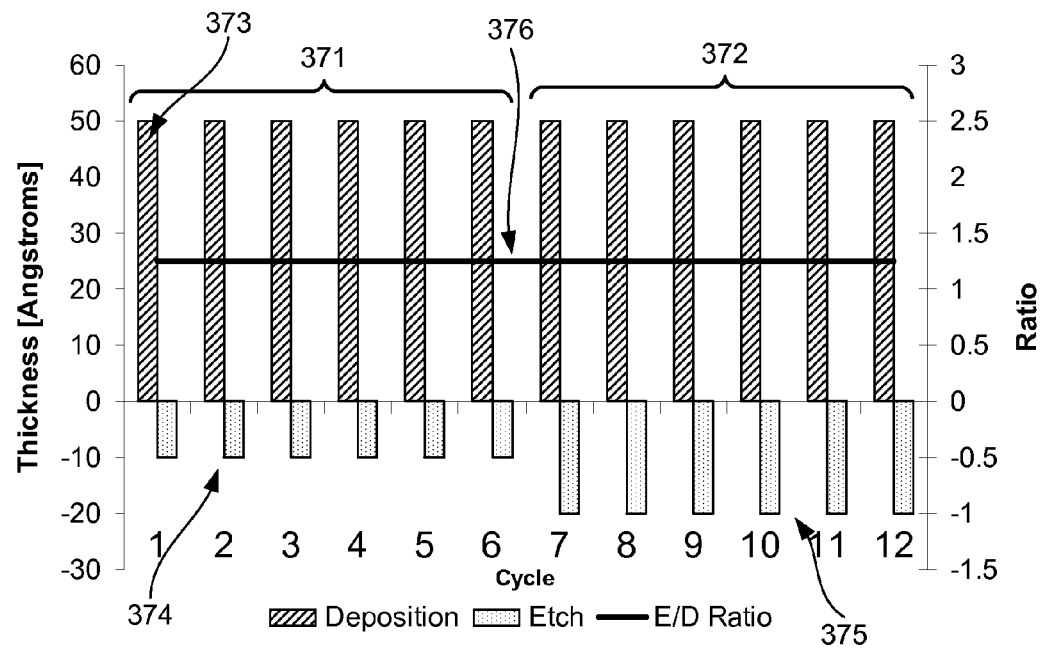
Figure 3F:
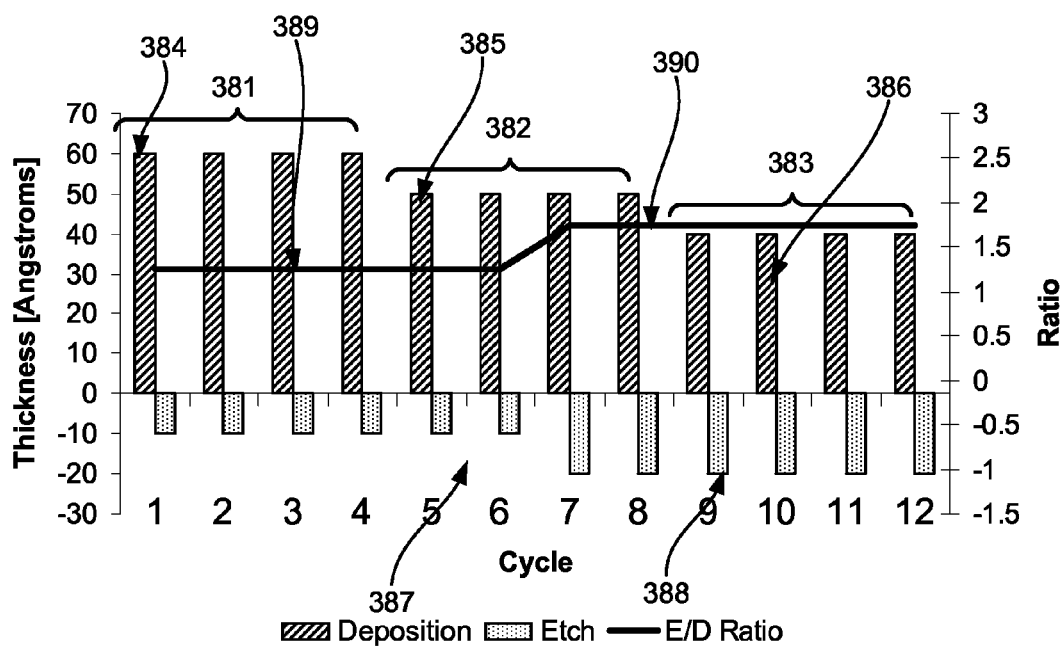

The above examples will now be described in the context of FIGS. 3D-3F illustrating plots of varying parameters for three different graded ALP processes. Each example process includes twelve cycles. However, it should be understood that any number of cycles may be used to achieve a target thickness of a diffusion barrier or seed layer. A target thickness of the layer in these examples is 420 Å and is specified for illustrative purposes only. It should be understood that this process can be applied to deposit conformal and continuous layers of any thicknesses appropriate for semiconductor manufacturing. The process is particularly attractive for depositing thin films where the risk of damaging is high.

Twelve cycles illustrated in FIG. 3D may be conceptually divided into three stages according to the values of the deposition amounts 364, 365, and 366 represented by striped vertical bars. Additionally, the etched amounts are shown with dotted vertical bars 367, and E/D ratios are represented by a solid line 368. Both are constant through the entire process. The first stage 361 includes first four cycles. 75 Å of diffusion barrier or seed material is deposited and 15 Å is etched away in each cycle. In certain embodiments, the deposition amounts are between about 30-120 Å (more specifically between about 50-100 Å), while the etched amounts are between about 0-30 Å (more specifically between about 10-20 Å). It should be understood that these parameters depend on the final target thickness of the layer, number of cycles, and process parameters in other cycles. The resulting net deposition is 60 Å per cycle or 240 Å for the entire first stage 361.

In the second stage 362, which also includes four cycles, the deposition amounts 365 are reduced to 50 ∈, while the etched amounts 367 remain the same at 15 Å. In certain embodiments, the deposition amounts are between about 10-90 Å (more specifically between about 30-70 Å), while the etched amounts are between about 0-30 Å (more specifically between about 10-20 Å). Since the processing in this stage is performed over a 240 Å deposited in the first stage 361, there is less concern about etching through the deposited layer and damaging the under layer and dielectric. The net deposition is 35 Å per cycle or 140 Å for the entire second stage 362. The total thickness of the deposited layer is therefore 380 Å after the second stage 362.

The last stage 363 also includes four cycles. The deposition amounts 366 are further decreased to 25 Å, while the etched amounts 367 remain the same at 15 Å. In certain embodiments, the deposition amounts are between about 10-40 Å (more specifically between about 20-30 Å), while the etched amounts are between about 0-30 Å (more specifically between about 10-20 Å). During this stage, there is even less concern about damaging dielectric because of the thicker 380 Å layer deposited during the first and second stages. The net deposition is 10 Å per cycle or 40 Å for this stage bringing the total thickness of the layer to the targeted 420 Å.

In this example, the E/D ratio 368 remains constant at about 1.25 in all cycles. In other embodiments, an E/D ratio may be changed. Generally, an E/D ratio is lower during initial cycles when the risk of damaging is high and then increased as the deposited layer thickens.

FIGS. 3D-3F do not show bias. It should be understood that bias may be applied to the substrate in some or all cycles according the description presented above. For example, no bias may be applied or certain cycles may have am etching bias of between about 0-1500 W or more specifically between about 0-750 W or between about 750-1500 W. Bias may be applied during both deposition and etching operations. Generally, bias is higher during etching operations. Further, one of the biases or both may be increased as the deposited layer thickens.

FIG. 3E shows another example plot of graded parameters used in the graded ALP process. In this example, the etched amounts 374 and 375 are changed between the sixth and seventh cycle. The first stage 371 includes six cycles; each cycle deposits 50 Å (bars 373) and etches 10 Å (bars 374) of diffusion barrier or seed material. In certain embodiments, the deposition amounts are between about 10-90 Å (more specifically between about 30-70 Å), while the etched amounts are between about 0-20 Å (more specifically between about 5-15 Å). The resulting net deposition is 40 Å per cycle and 240 Å for the entire first stage 371. A second stage 372 has another six cycles. The etched amounts 375 are increased to 20 Å, while the deposition amounts (bars 375) remain the same. In certain embodiments, the deposition amounts are between about 10-90 Å (more specifically between about 30-70 Å), while the etched amounts are between about 0-40 Å (more specifically between about 10-30 Å). This combination corresponds to a net deposition thickness of 30 Å per cycle or 180 Å for the second stage, or a targeted 420 Å thickness for the entire process. Similar to the previous example, the E/D ratio 376 remains constant at about 1.25 in all cycles.

Another example plot of graded parameters used in the graded ALP process is shown in FIG. 3F. The process may be divided into three stages 381, 382, and 383 or more stage. Further, stage 382 may be additionally divided into two more stages indicating a change in etched amounts from 10 Å (bars 387) during the first six cycles to 20 Å (bars 388) in the last six cycles. The first stage 381 has four cycle each depositing 60 Å (bars 384) and etching away 10 Å (bars 387) yielding 50 Å per cycle or 200 Å for the entire firsts stage. In certain embodiments, the deposition amounts are between about 20-100 Å (more specifically between about 40-80 Å), while the etched amounts are between about 0-20 Å (more specifically between about 5-15 Å).

The second stage 382 in this example has two cycles each depositing 50 Å (bars 385) and etching away 10 Å (bars 387) yielding 40 Å per cycle. In certain embodiments, the deposition amounts are between about 10-90 Å (more specifically between about 30-70 Å), while the etched amounts are between about 0-20 Å (more specifically between about 5-15 Å).

The second stage 382 has another two cycles each depositing 50 Å (bars 385) and etching away 20 Å (bars 388) yielding 30 Å per cycle. In certain embodiments, the deposition amounts are between about 10-90 Å (more specifically between about 30-70 Å), while the etched amounts are between about 0-40 Å (more specifically between about 10-30 Å). Therefore, the layer thickens by another 140 Å during the second stage totaling at 340 Å. Further, an increase in etched amounts from 10 Å to 20 Å also coincides with an increase in the E/D ratio from 1.25 (line 389) to 1.75 (line 390) from sixth to seventh cycle. However, such synchronization between etched amounts and E/D ratios is not necessary as it has been previously explain.

Finally, the last stage 383 includes four cycles each depositing 40 Å (bars 386) and etching away 20 Å (bars 388) yielding 20 Å per or 80 Å for the entire third stage 383. In certain embodiments, the deposition amounts are between about 10-70 Å (more specifically between about 20-60 Å), while the etched amounts are between about 0-40 Å (more specifically between about 10-30 Å). Therefore, the total thickness of the layer is 420∈. The E/D ratio during this stage is maintained at 1.75 (line 390).

Figure 4A:
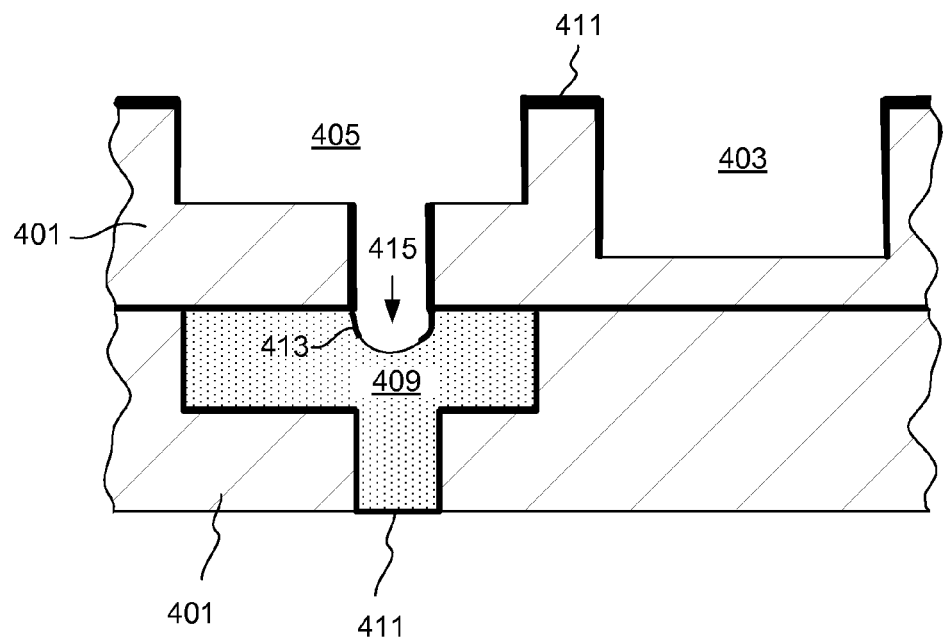
FIGS. 4A-4B show cross sectional depictions of device structures obtained during anchoring in a dual Damascene process with the use of atomic profiling methods described herein. Absence of microtrenching in a dielectric is illustrated.
Figure 4B:
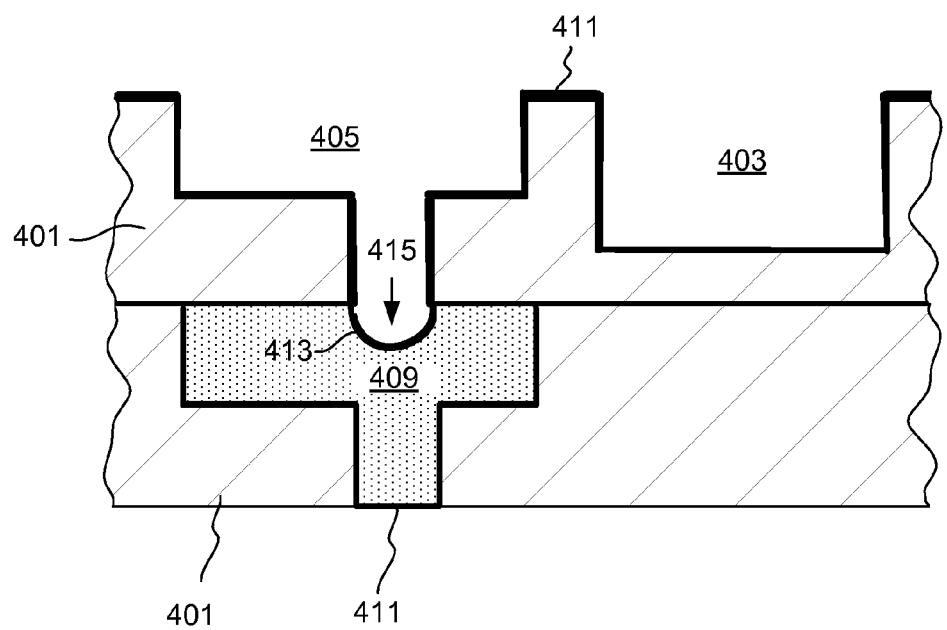

When ALP cycles are used in an anchoring process or in any other etch-back which inadvertently exposes layers of dielectric, microtrenching of dielectric is significantly reduced. FIG. 4A shows a cross-sectional depiction of a device structure obtained after anchoring with ALP cycles. The features of the structure are numbered analogously to features shown in FIG. 2C. It can be seen that unlike in FIG. 2C, the microtrenches are absent from the bottoms of trenches 403 and 405. Further, diffusion barrier layer covers the sidewalls of an anchor 419, thereby eliminating the weak spots 219 seen in FIG. 2D. After the flash layer of diffusion barrier material is deposited, the structure depicted in FIG. 4B results. It can be seen that diffusion barrier layer 405 conformally covers the structure in the field and within the recesses including the trench bottoms and the anchor. Weak uncoated spots within the anchor are therefore reduced. At least about 5 Å of diffusion barrier material has been deposited at the weak spots in the corners of an anchor during ALP cycles.

In one example embodiment, such anchoring is performed by depositing about 100 Å of TaN$_x$ followed by five ALP cycles and a deposition of a flash layer of Ta (about 100 Å). Each ALP cycle first deposits about 20 Å of Ta followed by etching of about 50 Å of material, thereby resulting in a net removal of about 30 Å of material per ALP cycle. These values refer to the thicknesses measured in the field region.

While ALP was described in the context of anchoring as a particularly suitable method for performing anchoring in the presence of exposed dielectric, it is not limited to this application. In general, it can replace one-step resputtering in those cases where good material coverage is needed at the corners of recesses (both for diffusion barrier and for seed layer materials), where more rounded recess bottoms are desired, and where efficient overhang clipping is needed.

Figure 5A:
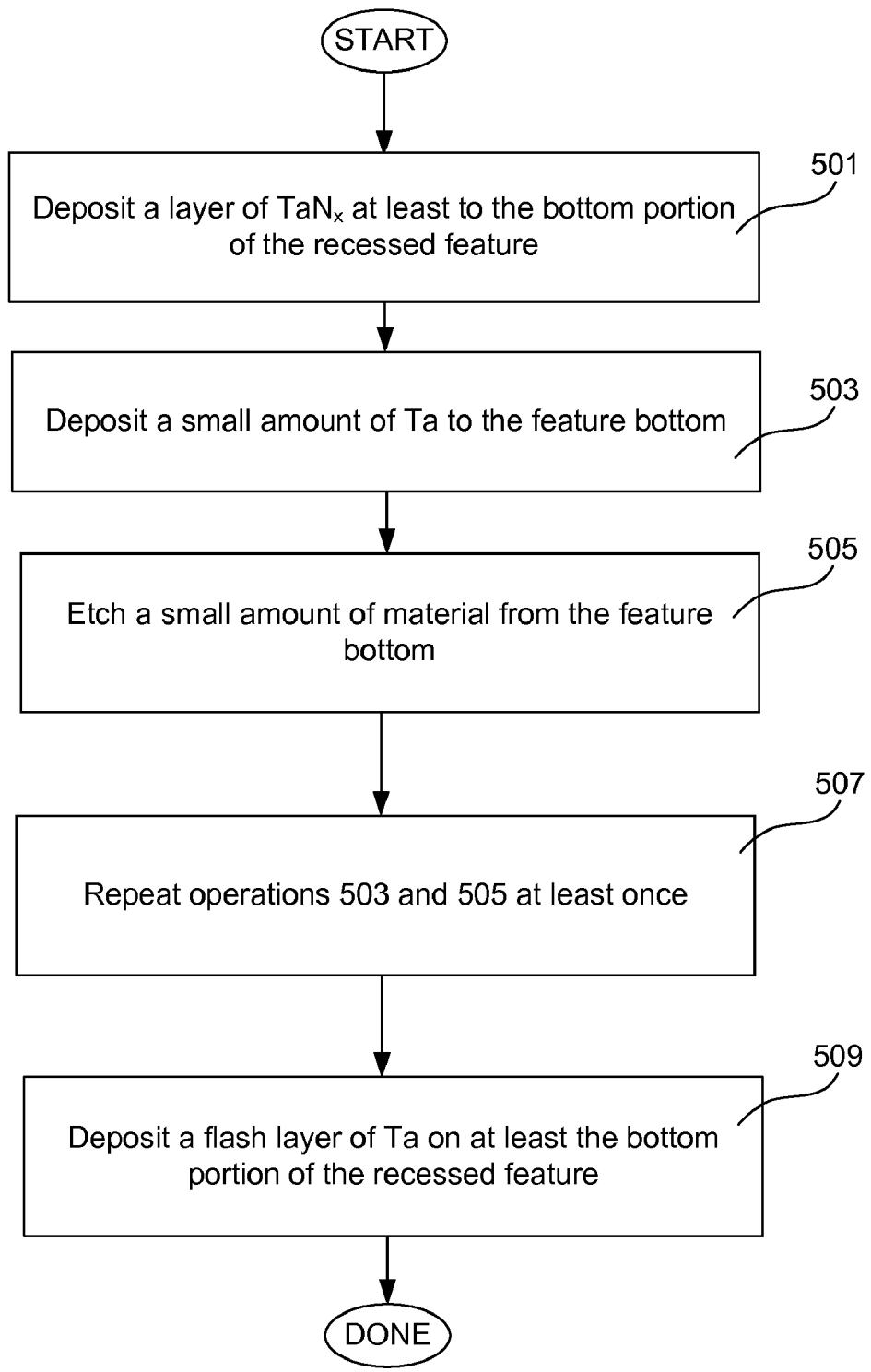
FIGS. 5A-5B present process flow diagrams in accordance with embodiments described herein.

FIG. 5A describes a specific embodiment that makes use of an ALP. The process illustrated in FIG. 5A starts by depositing a layer of TaN$_x$ at least on a bottom portion of a recessed feature in 501, e.g., in a tantalum PVD process chamber. The process follows by performing ALP cycles which include deposition of small amounts of tantalum, followed by short etch-back operations. The first profiling cycle deposits a small amount of tantalum at the recessed feature bottom from a tantalum sputter target in the same PVD chamber. The material is then etched from the feature bottom in an operation 505 completing the first ALP cycle. Then, next ALP cycle is performed by repeating tantalum deposition and etch-back. The ALP cycles are repeated until the necessary amount of material is removed or redistributed from the feature bottom. The flash layer of Ta is then deposited on the feature bottom in an operation 509.

ALP cycles can be performed, according to some embodiments, for TaN$_x$ etch-back, Ta etch-back, for anchoring, Ta flash layer etch-back, and copper seed layer etch back.

Figure 5B:
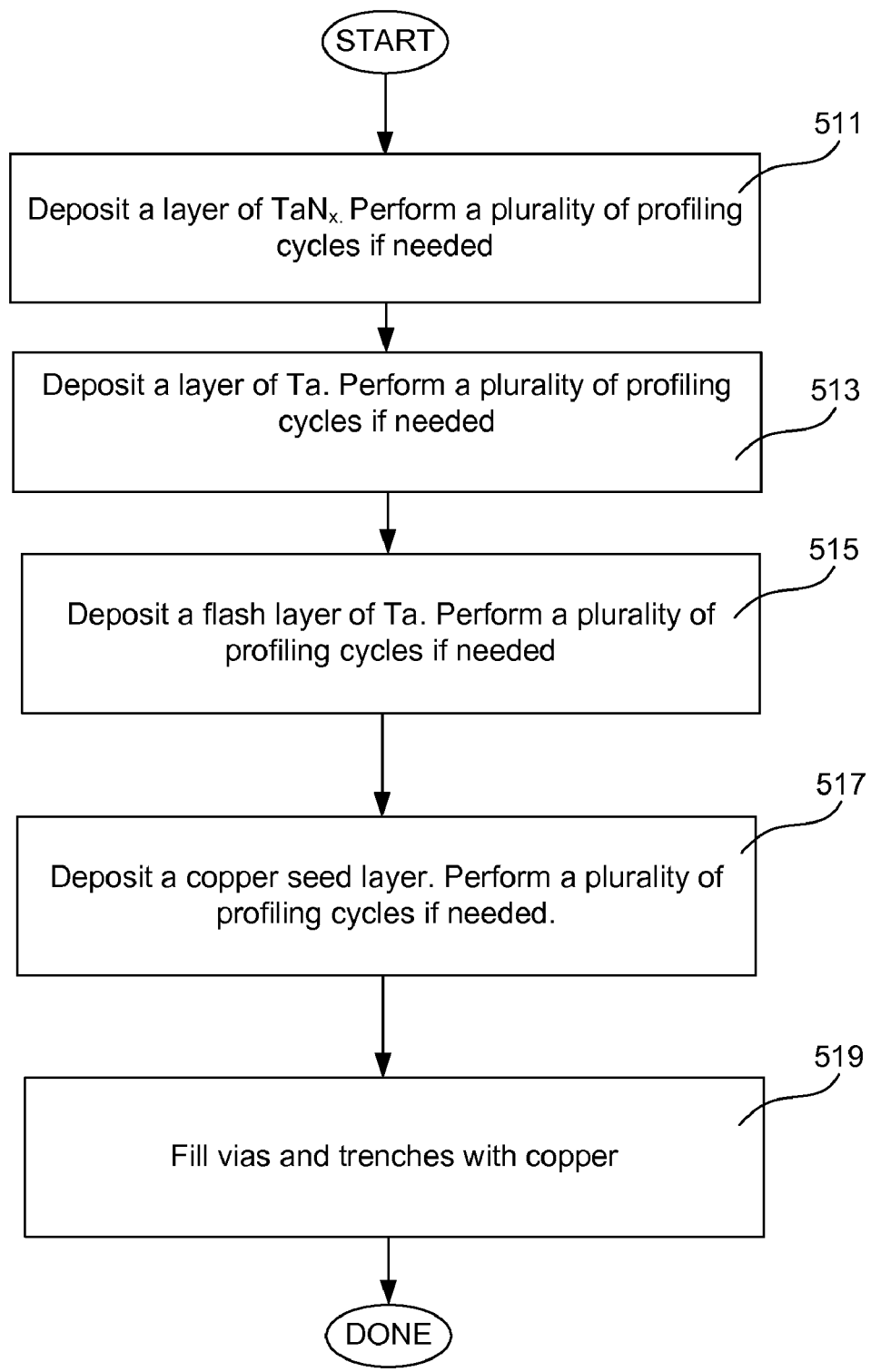

One example process flow diagram is shown in FIG. 5B. A substrate having recessed features is provided and a layer of TaN$_x$ is deposited in an operation 511. ALP etch-back can be performed on this layer by performing alternating resputtering and TaN$_x$ depositing operations as needed. Anchoring into an underlying copper layer may occur at this stage. Next, a layer of Ta can be deposited in an operation 513, and a plurality of ALP cycles can be performed if necessary. ALP cycles can include alternating Ta deposition from the sputter target and etching of material from the bottom of the recess. Anchoring into an underlying copper line can occur at this stage. Note that etch-back during anchoring when performed using ALP may include intermixing copper and tantalum-containing material on the sidewalls of recessed features, because mixtures of Ta and Cu are being sputtered onto the sidewalls. Such mixtures advantageously can serve as adhesion layers for subsequently deposited copper seed layers, leading to conformal deposition of copper seed layers. Such adhesion layers are described in detail in the commonly assigned U.S. patent application Ser. No. 11/807,178 titled "Methods and Apparatus for Engineering an Interface between a Diffusion Barrier Layer and a Seed layer" filed on May 24, 2007 and incorporated by reference in its entirety and for all purposes. After an anchor recess is formed, a flash layer of Ta is deposited, and a plurality of profiling cycles is performed if needed in an operation 515. The substrate is then transferred from a diffusion barrier PVD chamber to a copper seed PVD chamber and a seed layer of copper (or copper alloy) is deposited on top of the diffusion barrier layer. If necessary a copper seed layer etch-back is performed using ALP cycles, as shown in 517. Copper ALP cycles involve alternating operations of depositing copper from the sputter target and etch-back operations. A flash layer of copper can then be deposited. After the seed layer has been deposited, the substrate can be transferred to an electrofill module, and copper can be deposited into the vias and trenches using electrodeposition.

The need for performing ALP cycles, and the number of ALP cycles for each particular operation shown in the process flow diagram of FIG. 5B, will be appreciated by one skilled in the art. For example, ALP cycles would usually be desired if etch-back involves exposing dielectric materials to resputtering plasma. This can occur, for example, during operations 511 and 513. Further ALP cycles may be needed for overhang reshaping, e.g., in operations 515 and 517. Further, improved material coverage at the corners of recessed feature bottoms often becomes important during seed layer deposition and diffusion barrier deposition and rounded recess bottoms may be desired for this reason.

Example process conditions for operation 511 will be listed. The following conditions are suitable for TaN$_x$ deposition. DC target power can range from about 20-70 kW, preferably 20-30 kW, e.g., about 30 kW. RF wafer power can be in the range of about 0-1500 W, preferably 600-1200 W, e.g., about 800-1200 W. The pressure can range from about 0.5-3 mTorr. Argon can be supplied at a flow rate of about 5-100 sccm, preferably 10-50 sccm, e.g., about 20-40 sccm. Nitrogen can be supplied at a flow rate of between about 5-100 sccm, preferably 5-50 sccm, e.g., about 20-40 sccm The following conditions can be used for resputter. DC target power can range from about 1-10 kW, preferably 2-8 kW, e.g., about 4-8 kW. RF wafer power can be in the range of about 200-1500 W, preferably 400-1200 W, e.g., about 400-1000 W. The pressure can range from about 0.5-10 mTorr.

Example process conditions for Ta deposition in operation 513 can be the following. DC target power of about 20-70 kW, RF wafer power of about 0-1500 W, and pressure of about 0.1-3 mTorr can be used. In a particular embodiment, DC target power ranges from about 20-30 kW, RF wafer bias power is in the range of about 600-1200 W, and pressure is about 0.5-3 mTorr. In a specific example, a DC target power of about 30 kW, an RF wafer bias power of about 0-1500 W, and a pressure of about 0.5-3 mTorr are used. Resputtering conditions in operation 513 can be the following. DC target power of about 1-10 kW, RF wafer power of about 200-1500 W, and pressure of about 0.5-100 mTorr can be used. In a particular embodiment, DC target power ranges from about 2-8 kW, RF wafer bias power is in the range of about 400-1200 W, and pressure is about 0.5-10 mTorr. In a specific example, a DC target power of about 4-8 kW, an RF wafer bias power of about 400-1000 W, and a pressure of about 0.5-3 mTorr are used.

Example process conditions for operation 515 include can be similar to conditions listed for operation 513.

Example process conditions for copper deposition in operation 517 can be the following. DC target power of about 300-110 kW, RF wafer power of about 0-2000 W, and pressure of about 0.05-5 mTorr can be used. In a particular embodiment, DC target power ranges from about 30-80 kW, RF wafer bias power is in the range of about 0-1200 W, and pressure is about 0.05-5 mTorr. In a specific example, a DC target power of about 60-80 kW, an RF wafer bias power of about 0-1000 W, and a pressure of about 0.05-5 mTorr are used. Resputtering conditions in operation 517 can be the following. DC target power of about 1-10 kW, RF wafer power of about 200-1500 W, and pressure of about 0.5-100 mTorr can be used. In a particular embodiment, DC target power ranges from about 2-8 kW, RF wafer bias power is in the range of about 400-1200 W and pressure is about 0.5-10 mTorr. In a specific example, a DC target power of about 4-8 kW, an RF wafer bias power of about 400-1000 W, and a pressure of about 0.5-3 mTorr are used.

A variety of ALP process flow can be used in barrier deposition. One example process flow involves depositing 80 Å of TaN$_x$, followed by three ALP cycles and a deposition of 70 Å of tantalum. ALP cycles include depositing 30 Å of Ta and etching 70 Å of material in each cycle. This process flow can be presented as a 80 Å TaN/(30–70 Å etchback)×3/70 Å Ta. These values refer to thicknesses measured in the field.

Another example process flow involves depositing 100 Å of TaN$_x$, followed by five ALP cycles and a deposition of 100 Å of tantalum. ALP cycles include depositing 20 Å of Ta and etching 50 Å of material in each cycle. This process flow can be presented as 100 Å TaN$_x$/(20–50 Å etchback)×5/100 Å Ta.

Another example process flow involves depositing 100 Å of TaN$_x$, followed by three ALP cycles and a deposition of 100 Å of tantalum. ALP cycles include depositing 35 Å of Ta and etching 70 Å of material in each cycle. This process flow can be presented as 100 Å TaN$_x$/(35–70 Å etchback)×3/100 Å Ta.

Another example process flow starts by performing 3 ALP cycles that involve depositing TaN$_x$. Each ALP cycle deposits 16 Å of TaN$_x$ and etches 4 Å of material. Next four Ta ALP cycles are performed. Each ALP cycle deposits 16 Å of Ta and etches about 25 Å of material. After ALP cycles are completed a 30 Å thick flash layer of Ta is deposited. This process flow can be presented as (16–4 Å)×3TaN$_x$/(16–25 Å etchback)×4/30 Å Ta.

One skilled in the art will understand that many variations of ALP processes can be envisioned and practiced. The provided examples serve as illustrations and do not limit the scope of the invention.

A variety of PVD process chambers can be used for depositing and resputtering operations used in the provided methods. For example, PVD process chambers that include a hollow cathode magnetron or a planar magnetron can be used.

Hollow cathode magnetron is an apparatus carrying a three-dimensional sputter target. The resputtering and depositing operations described herein are not limited to a specific cup-like geometry of an HCM target and can be used in conjunction with three-dimensional and planar targets of a plurality of shapes. Further, in some embodiments, resputtering can be carried out in a plasma pre-clean chamber which typically does not include a sputter target and in a plasma enhanced ALD chamber.

Figure 6:
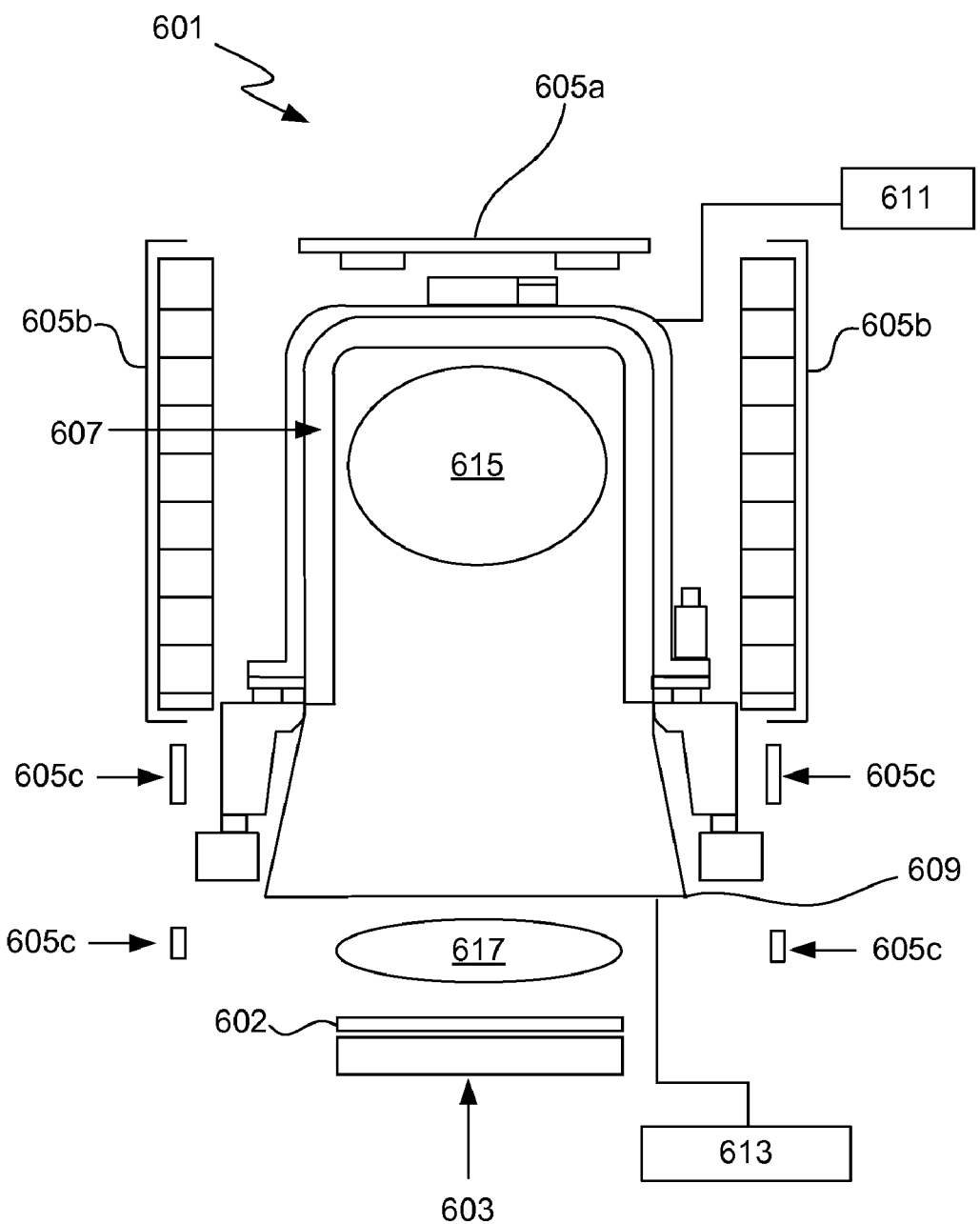
FIG. 6 is a cross sectional depiction of the hollow cathode magnetron (HCM) apparatus suitable for practicing methods described herein.

FIG. 6 presents a cross sectional view of one type of an HCM sputtering apparatus that can be used in accordance with the invention. The HCM apparatus has two main components, the source 601, in which a plasma is created and maintained, and the RF bias electrostatic chuck (ESC) pedestal 603, which secures the wafer 602 and applies an RF bias on the wafer, if needed. In this example, the source 601 contains a top rotating magnet 605a, several side electromagnets 605b-605c, circumferentially positioned around the process chamber, and a sputter target 607, operated at a negative DC bias. One or several shields may be positioned within the chamber next to the chamber sidewalls, to protect the sidewalls from the sputtered material. While the shield 609 is often referred as an anode, this shield operates at a floating potential and is not additionally electrically biased.

The cathode target 607 generally has a hollow cup-like shape so that plasma formed in the source can be concentrated within this hollow region. The cathode target 607 also serves as a sputter target and is, therefore, made of a metal material such as tantalum or copper, which is to be deposited onto a substrate.

An inert gas, such as argon, is introduced through a gas inlet into the hollow region of the cathode target 607 powered by a DC source to form a plasma. The pump 613 is positioned to evacuate or partially evacuate the process chamber. The control of pressure in the process chamber can be achieved by using a combination of gas flow rate adjustments and pumping speed adjustments, making use of, for example, a throttle valve or a baffle plate. The pressure used during deposition and resputter can range from between about 0.01 to about 100 mTorr. In some embodiments resputtering is performed at a higher pressure than deposition, e.g., deposition can be performed at pressures of less than about 1 mTorr, while resputtering can be performed in the pressure range of about 2-100 mTorr.

An intense magnetic field is produced by electromagnets 605a-605b within the cathode target region. Additional electromagnets 605c are arranged downstream of the cathode target so that different currents can be applied to each electromagnet, thereby producing an ion flux and a controlled deposition and/or etch rate and uniformity.

In one implementation, the polarity of the magnetic field generated by the electromagnetic coils 605b and by the downstream electromagnets 05c is selected to be opposite, such that a region of null magnetic field, known as a separatrix exists between the high density plasma 615 and a region of plasma 617 adjacent to the wafer surface.

Electromagnets 605c arranged downstream of the cathode target are configured so that different currents can be applied to each electromagnet, thereby controlling an ion flux, deposition and/or etch rate and uniformity in the proximity of the wafer. A floating shield 609, existing in equilibrium with the floating plasma potential, is used, in conjunction with the source electromagnets to shape the plasma distribution at the target mouth. The ESC pedestal 603 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40-−20° C. while the shields of an apparatus are kept at a higher temperature of about 25-500° C., preferably 100-200° C. Typically, argon or helium backside gas is used to provide thermal coupling between the substrate and the ESC.

In certain embodiments, a system controller 611 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 605b and 605c, power levels and current levels applied to the coils, wafer chuck or susceptor position, and other parameters of a particular process. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, FORTRAN or others. Compiled object code or script is executed by the processor to perform the tasks identified in the program.

The controller parameters relate to process conditions such as, for example, magnetic field within the chamber, plasma density within the chamber, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck and DC power levels applied to the target, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing the methods described herein. For example, the instructions can specify the parameters for performing a plurality of profiling cycles, e.g., in a diffusion barrier or a copper seed deposition chamber.

EXPERIMENTAL

Figure 7A:
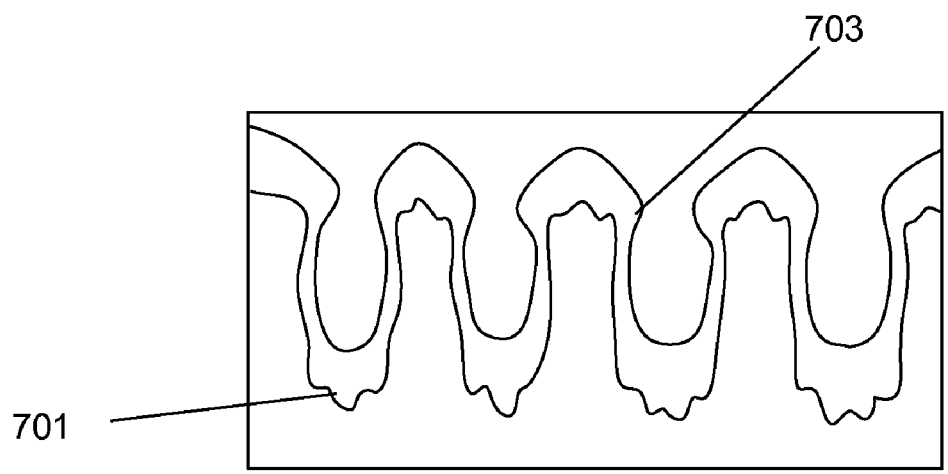
FIG. 7A is an SEM image of a narrow trench array subjected to conventional resputtering.

FIG. 7A presents an SEM image of a narrow trench array that was subjected to a D(TaNx)/D(Ta)/E(anchoring)/D(Ta) sequence. Microtrenching 701 and large overhang 703 is observed.

Figure 7B:
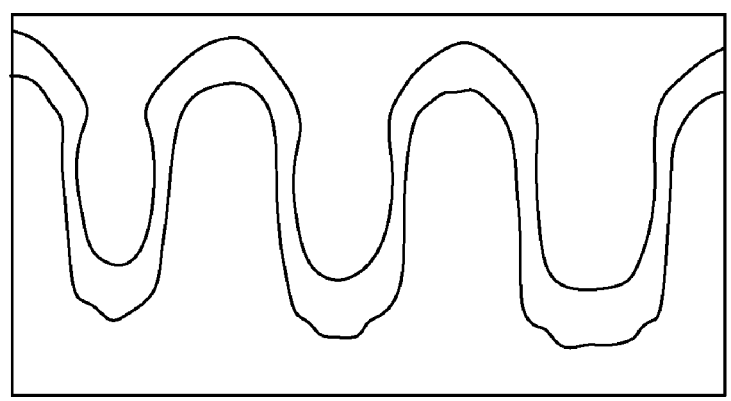
FIG. 7B is an SEM image of a narrow trench array subjected to atomic layer profiling cycles in accordance with an embodiment described herein.
Figure 7C:
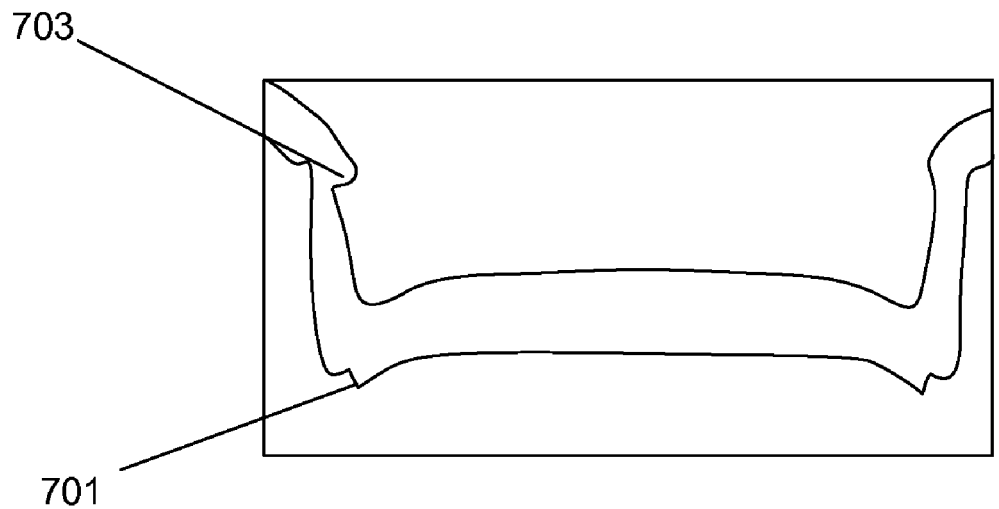
FIG. 7C is an SEM image of a wide trench subjected to conventional resputtering.

FIG. 7B presents an SEM image of a narrow trench array that was subjected to a D(TaN$_x$)/ALP/D(Ta) sequence. Low overhang and no microtrenching is observed. The aspect ratio of trenches in this array is about 2. It is noted that provided methods are very suitable for resputtering materials on substrates having high aspect ratio trenches (e.g., trenches with an aspect ratio of at least 2). Resputtering very often exposes dielectric in high aspect ratio trenches, since little selectivity exists between via bottom and trench bottom etching in this case. The following process flow has been used to obtain the illustrated device 100 Å TaN$_x$/(35∈Ta–70 Å etchback)×3/100 Å Ta FIG. 7C presents an SEM image of a wide trench that was subjected to a D(TaN$_x$)/D(Ta)/E(anchoring)/D(Ta) sequence. Microtrenching 701 and large overhang 703 is observed.

Figure 7D:
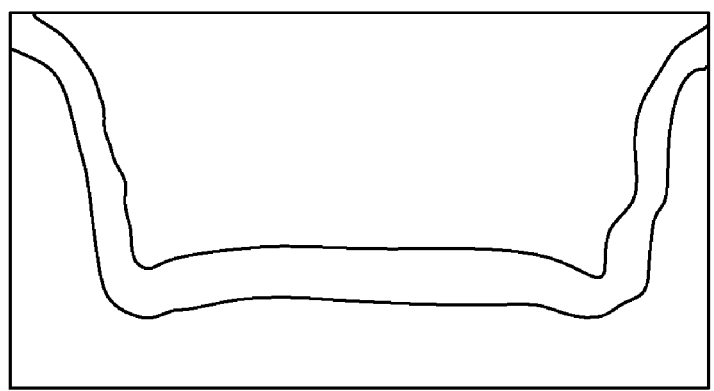
FIG. 7D is an SEM image of a wide trench subjected to atomic layer profiling cycles in accordance with an embodiment described herein.

FIG. 7D presents an SEM image of a wide trench that was subjected to a D(TaN$_x$)/ALP/D(Ta) sequence. Low overhang and no microtrenching is observed. The aspect ratio of trenches in this array is about 1. The same ALP process flow listed for FIG. 7B has been used.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

Conclusion

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method for depositing a layer of diffusion barrier or seed material on a semiconductor substrate having a recessed feature, the method comprising:
    performing a first net deposition cycle including
        depositing a first deposited layer of the diffusion barrier or seed material and
        etching the first deposited layer to form a first etched layer having a first net deposited thickness; and
    performing a second net deposition cycle including
        depositing a second deposited layer of the diffusion barrier or seed material the first etched layer and
        etching the second deposited layer to form a second etched layer over the first etched layer, the second etched layer having a second net deposited thickness, wherein the first net deposited thickness is greater than the second net deposited thickness and wherein no etching bias is applied to the semiconductor substrate during etching of the first deposited layer and wherein an etching bias is applied during etching of the second deposited layer.

2. The method of claim 1, wherein the thickness of the first deposited layer is between about 2 and 100 Angstroms and the thickness of the second deposited layer is between about 2 and 50 Angstroms.

3. The method of claim 1 comprising between about 2 and 20 net deposition cycles.

4. The method of claim 1, further comprising a third net deposition cycle including depositing a third deposited layer of the diffusion barrier or seed material, wherein the thickness of the third deposited layer is different than the thickness of the first deposited layer and different than the thickness of the second deposited layer.

5. The method of claim 1, wherein a thickness difference between the first etched layer and the first deposited layer is approximately the same as a thickness difference between the second etched layer and the second deposited layer.

6. The method of claim 1, wherein a thickness difference between the first etched layer and the first deposited layer is less than a thickness difference between the second etched layer and the second deposited layer.

7. The method of claim 1, wherein the first deposited layer is thicker than the second deposited layer.

8. The method of claim 1, wherein etching during the first net deposition cycle is performed at a first etching etch rate to deposition rate (E/D) ratio and etching during the second net deposition cycle is performed at a second etching E/D ratio, and wherein the first etching E/D ratio is different than the second etching E/D ratio.

9. The method of claim 8, wherein the first etching E/D ratio is between about 0 and 2 and the second etching E/D ratio is between about 0 and 6.

10. The method of claim 1, wherein the first net deposition cycle and the second net deposition cycle are performed in a plasma vapor deposition (PVD) process chamber.

11. The method of claim 1, wherein the first net deposition cycle and the second net deposition cycle are performed in a process chamber comprising a hollow cathode magnetron.

12. The method of claim 1, wherein the diffusion barrier or seed material comprises a material selected from the group consisting of Ta, TaN$_x$, Ti, TiN$_x$, W, WN$_x$, Ru, Mn, and Co.

13. The method of claim 1, wherein the diffusion barrier or seed material comprises a material selected from the group consisting of copper, manganese, aluminum, and alloys of those metals.

14. The method of claim 1, wherein the first net deposition cycle and the second net deposition cycle are performed in a plasma vapor deposition (PVD) process chamber.

15. A method for depositing a layer of diffusion barrier or seed material on a semiconductor substrate having a recessed feature, the method comprising:

performing a first net deposition cycle including
   depositing a first deposited layer of the diffusion barrier or seed material and
   etching the first deposited layer to form a first etched layer having a first net deposited thickness; and
performing a second net deposition cycle including
   depositing a second deposited layer of the diffusion barrier or seed material the first etched layer and
   etching the second deposited layer to form a second etched layer over the first etched layer, the second etched layer having a second net deposited thickness, wherein the first net deposited thickness is greater than the second net deposited thickness and wherein the diffusion barrier or seed material comprises a material selected from the group consisting of copper, manganese, aluminum, and alloys of those metals.

16. The method of claim 15, wherein the thickness of the first deposited layer is between about 2 and 100 Angstroms and the thickness of the second deposited layer is between about 2 and 50 Angstroms.

17. The method of claim 15, further comprising a third net deposition cycle including depositing a third deposited layer of the diffusion barrier or seed material, wherein the thickness of the third deposited layer is different than the thickness of the first deposited layer and different than the thickness of the second deposited layer.

18. The method of claim 15, wherein the first deposited layer is thicker than the second deposited layer.

19. The method of claim 15, wherein a first etching bias is applied to the semiconductor substrate during etching of the first deposited layer and a second etching bias is applied during etching of the second deposited layer, and wherein the first etching bias is less than the second etching bias.

* * * * *